US012721192B2

(12) United States Patent
Elsherbini et al.

(10) Patent No.: US 12,721,192 B2
(45) Date of Patent: Aug. 25, 2026

(54) VIA MICRO-MODULES FOR THROUGH MOLD VIA REPLACEMENT

(71) Applicants: Adel A. Elsherbini, Tempe, AZ (US); Telesphor Kamgaing, Chandler, AZ (US)

(72) Inventors: Adel A. Elsherbini, Tempe, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 439 days.

(21) Appl. No.: 17/561,531

(22) Filed: Dec. 23, 2021

(65) Prior Publication Data

US 2023/0207436 A1 Jun. 29, 2023

(51) Int. Cl.

| | |
|---|---|
| ***H10W 70/63*** | (2026.01) |
| ***H10W 70/65*** | (2026.01) |
| ***H10W 70/692*** | (2026.01) |
| ***H10W 90/00*** | (2026.01) |

(52) U.S. Cl.

CPC ......... *H10W 70/635* (2026.01); *H10W 70/65* (2026.01); *H10W 70/692* (2026.01); *H10W 90/00* (2026.01)

(58) Field of Classification Search

None

See application file for complete search history.

(56) References Cited

U.S. PATENT DOCUMENTS

| | | | | |
|---|---|---|---|---|
| 10,373,893 | B2 * | 8/2019 | Vaidya | H01L 25/0655 |
| 10,763,239 | B2 * | 9/2020 | Chen | H01L 24/19 |
| 10,943,869 | B2 | 3/2021 | Zhai | |
| 2013/0105987 | A1 * | 5/2013 | Gallegos | H01L 21/486 257/E21.586 |
| 2019/0139920 | A1 * | 5/2019 | Lee | H01L 25/0655 |
| 2019/0198445 | A1 | 6/2019 | Alur | |
| 2020/0365477 | A1 | 11/2020 | Moitzi | |

(Continued)

FOREIGN PATENT DOCUMENTS

| | | | |
|---|---|---|---|
| CN | 103477423 | B | 2/2017 |
| JP | 2013175495 | A | 9/2013 |

(Continued)

OTHER PUBLICATIONS

Search Report from European Patent Application No. 22205734.1, mailed May 30, 2023, 7 pgs.

(Continued)

*Primary Examiner* — Kretelia Graham
*Assistant Examiner* — Nkechinyere Esiaba
(74) *Attorney, Agent, or Firm* — Schwabe, Williamson & Wyatt, P.C.

(57) ABSTRACT

Embodiments disclosed herein include die modules, electronic packages, and systems. In an embodiment, a die module comprises a first substrate and a first die over the first substrate. In an embodiment, the die module further comprises a second die over the first substrate adjacent to the first die. In an embodiment, the die module further comprises a via module through the first substrate. In an embodiment, the via module comprises a second substrate, where the second substrate comprises glass, and a via through the second substrate.

18 Claims, 23 Drawing Sheets

(56) References Cited

U.S. PATENT DOCUMENTS

| | | | | |
|---|---|---|---|---|
| 2020/0381361 | A1* | 12/2020 | Zhao | H01L 23/49816 |
| 2021/0118765 | A1* | 4/2021 | Kang | H01L 23/5389 |
| 2021/0249345 | A1 | 8/2021 | Chen | |
| 2021/0335726 | A1 | 10/2021 | Wu | |
| 2022/0278032 | A1 | 9/2022 | Pietambaram | |
| 2023/0124783 | A1* | 4/2023 | Kim | H01L 25/105 257/712 |

FOREIGN PATENT DOCUMENTS

| | | |
|---|---|---|
| JP | 6761592 B2 | 9/2020 |
| WO | WO 2019/132964 | 7/2019 |

OTHER PUBLICATIONS

Office action from U.S. Appl. No. 17/561,553, mailed Feb. 13, 2025, 15 pgs.

Office action from U.S. Appl. No. 17/561,553, mailed Jul. 16, 2025, 15 pgs.

* cited by examiner 440
431
443
443
442

445
431
443
443
430

800
805
802
803
883
821
820
882
881
804
871
872

960
904

985
960
904

942
960
904

942
961
960
904

961
960
904

962
961
960
904

962
965
966
961
960
904
986

962
964
965
966
961
960
904
986

VIA MICRO-MODULES FOR THROUGH MOLD VIA REPLACEMENT

TECHNICAL FIELD

Embodiments of the present disclosure relate to electronic packages, and more particularly to electronic packages with via modules for replacing through mold vias.

BACKGROUND

Some 3D packaging architectures depend on creating through dielectric vias (TDVs) in a dielectric material that can be organic or inorganic. These connections may be used for multiple purposes, such as power delivery or high-speed signaling. The TDVs need to support high aspect ratios in order to enable the high density required for advanced packaging architectures. In some instances, the TDVs may also need non-cylindrical shapes in order to provide improved power delivery and/or signal isolation.

One type of TDV is a through mold via. Through mold vias are typically created by laser drilling a mold layer after the mold is cured. However, through mold vias suffer from low aspect ratio (which lowers signal density) and relatively low throughput (which increases costs). Additionally, such solutions cannot support non-circular TDV structures without added cost (i.e., requiring multiple drills). A second type of TDV is a copper pillar. Copper pillars are typically plated first, and then the dielectric is deposited over the copper pillars. These TDVs require high aspect ratio lithography, which can be challenging with typically used photoresist materials. Yet another solution is to use through silicon vias (TSVs). However, TSVs require the use of expensive silicon substrates. The processing is also relatively expensive. Furthermore, since silicon is conductive, the resulting TSVs may suffer from added parasitic capacitance that impacts the performance of high-speed IO links.

In other 3D packaging architectures a mold material is provided as an interposer and/or as an overmold over dies in the structure. Unfortunately, most overmold materials are organic materials with inorganic fillers that suffer from relatively high coefficient of thermal expansion (CTE) and low stiffness. This results in warpage, which can interfere with fine pitch assembly and cause reliability concerns. Additionally, such overmold materials limit the high temperature exposure allowance, which limits the maximum temperatures of the next processing operations.

Adding inorganic fillers or increasing the filler ratio can lower the overall CTE. However, this also increases the viscosity and may not allow placing the dies close enough to each other. Additionally, it is difficult to achieve high enough fill ratios to reduce the CTE sufficiently. Furthermore, the fillers do not significantly increase the stiffness of the structure. High deposition rate chemical vapor deposition (CVD) materials (e.g., oxides and nitrides) may be used. However, processing is expensive, and generally cannot be used to deposit thicknesses that are much larger than a few tens of micrometers.

EMBODIMENTS OF THE PRESENT DISCLOSURE

Described herein are electronic packages with via modules for replacing through mold vias, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
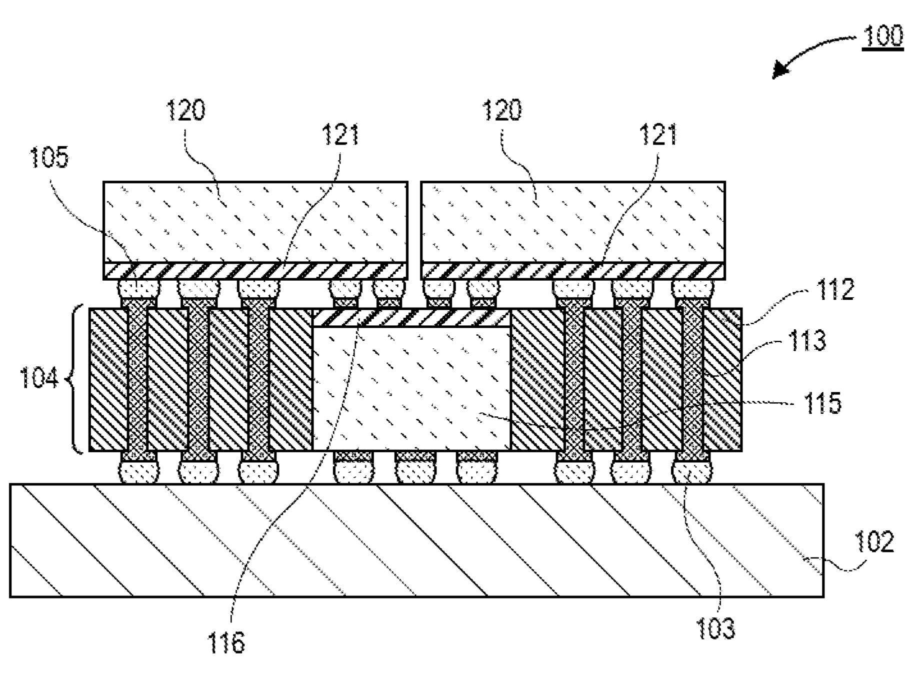
FIG. 1 is a cross-sectional illustration of an electronic package with a molded interposer, in accordance with an embodiment.

FIG. 1 is a cross-sectional illustration of an electronic package 100 used to provide context for embodiments disclosed herein. As shown, the electronic package 100 includes a package substrate 102. A die module is attached to the package substrate by interconnects 103, such as solder. The die module may include an interposer 104 and dies 120 over the interposer 104. Routing layers 121 may face towards the interposer 104. An embedded die 115 with routing layers 116 faces the dies 120. Die 115 may be a bridge die that electrically couples the first die 120 to the second die 120. The dies 120 may also be coupled to vias 113 through the interposer 104 by interconnects 105.

As noted above, the interposer 104 typically includes an organic or an inorganic material. When organic materials are used, the through dielectric vias (TDVs) 113 may be laser drilled or plated as copper pillars. Both options have drawbacks, as detailed above. When an inorganic material (e.g., silicon) is used as the interposer, the costs are typically much higher.

Accordingly, embodiments disclosed herein include interposers 104 that include glass via modules. The glass via modules are inserts of glass that are embedded in a mold layer (e.g., an organic mold layer). The glass substrate enables finer pitched vias to be manufactured in a cost effective manner. For example, laser assisted etching processes, photo-definable glass substrates, and the like may be used to pattern holes into which the conductive vias are formed. The finer pitch allows for high signal densities. Such patterning processes also enable non-circular via topologies that are useful for signal shielding and power delivery applications. In some embodiments, the via modules may also include one or more redistribution layers in order to fan out/fan in signals. Passives (e.g., inductors, capacitors, transformers, etc.) may also be integrated in the via modules in some embodiments. Additionally, the via modules can be selectively used where needed, and traditional TDV architectures can be used elsewhere (e.g., where lower density routing is acceptable). Glass TDVs also provide better parasitic resistance, capacitance, and inductance compared to TSVs.

Additionally, embodiments may include providing glass interposers. The use of a glass interposer provides improved control of CTE compared to organic molded interposers. In such embodiments, high density vias may be patterned in the glass, similar to the embodiments described above with respect to the via modules. Additionally, cavities (either blind cavities or through cavities) can be provided into the glass interposer in order to embed dies. In some embodiments, portions of the glass may be removed and filled with mold material. This may help provide a mechanical transition in order to reduce die stresses or control the package warpage during die to package or package to board attachment.

In yet another embodiment, overmolded dies are overmolded with a glass layer instead of an organic molding compound. For example, through cavities can be provided through the glass layer to accommodate the top dies in an electronic package similar to the one shown in FIG. 1. Alternatively, the glass layer may have blind cavities into which the dies are embedded. Such topologies may include silicon interposers, or include any of the interposer architectures described herein.

Figure 2A:
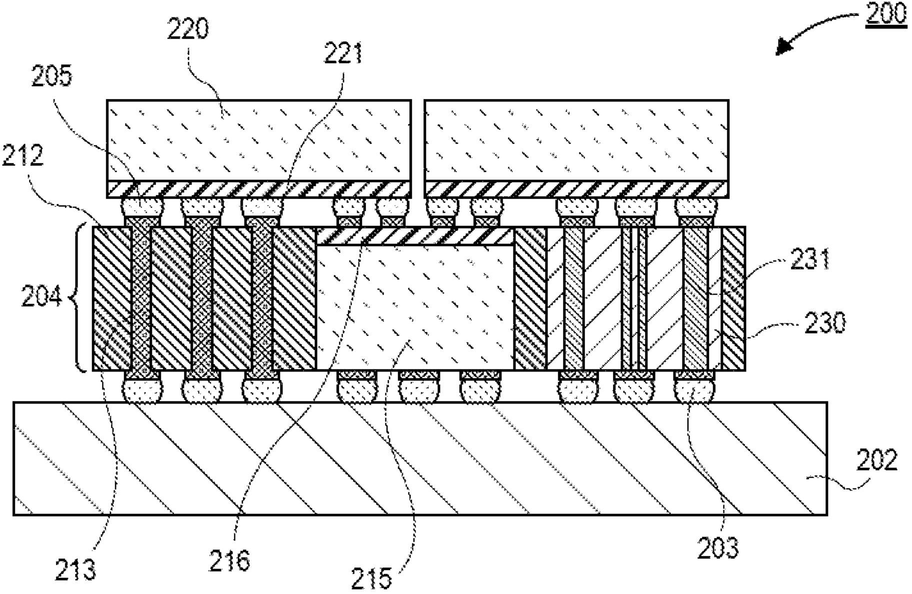
FIG. 2A is a cross-sectional illustration of an electronic package with a molded interposer with a glass via module embedded in the mold layer, in accordance with an embodiment.

Referring now to FIG. 2A, a cross-sectional illustration of an electronic package 200 is shown, in accordance with an embodiment. In an embodiment, the electronic package 200 comprises a package substrate 202. The package substrate 202 may include conductive routing (not shown) in order to electrically couple an overlying die module to a board (not shown). The package substrate 202 may be coupled to the die module by interconnects 203, such as solder bumps or the like.

In an embodiment, the die module comprises an interposer 204 that is below one or more dies 220. The dies 220 may have an active surface 221 that is coupled to the interposer 204 by interconnects 205. Solder bumps are shown as the interconnects 205, but it is to be appreciated that any first level interconnect (FLI) architecture may be used. In an embodiment, the interposer 204 comprises a mold layer 212. The mold layer 212 may be an organic molding compound with or without inorganic fillers. In an embodiment, TDVs 213 may pass through the mold layer 212 in some embodiments. Additionally, one or more dies 215 may be embedded in the mold layer 212. The die 215 may be a bridge die that electrically couples together two of the top dies 220. In an embodiment, the die 215 may be a passive die, or the die 215 may comprise active circuitry (e.g., silicon based, III-V based, or the like). An active surface 216 may face the top dies 220 or the package 202. In some embodiments, the die 215 may also include TSVs in order to provide an electrical connection to a backside of the die 215.

In an embodiment, the interposer 204 may also comprise a via module 230. The via module 230 may be a glass substrate. Through glass vias (TGVs) 231 may pass through a thickness of the via module 230. In an embodiment, the TGVs 231 may have a higher aspect ratio than the TDVs 213. As such, high density signaling may be enabled by the via module 230. In an embodiment, the via module 230 may have a thickness that is substantially similar to a thickness of the mold layer 212. As used herein, when values are said to be substantially similar, it is to be appreciated that the difference between the two values may be 10%. For example, a thickness between 90 μm and 110 μm may be substantially similar to a thickness that is 100 μm.

In an embodiment, the TGVs 231 may be formed with any suitable patterning and metal deposition process. In some embodiments, openings for the TGVs 231 are formed with a laser assisted etching process. In such an embodiment, a laser is used to expose regions of the glass substrate. The exposed regions undergo a morphological change that alters the resistance to an etchant. An etching process is then used to selectively remove the exposed regions. Laser assisted etching processes may sometimes result in sidewalls that are tapered. When laser exposure is made on both sides of the glass substrate, an hourglass-shaped cross-section may be provided. In another embodiment, the openings for the TGVs 231 may be made using a photo-definable glass substrate. In such embodiments, a mask is used to selectively expose regions of the glass substrate. The exposed regions are can then be removed with an etching process.

Figure 2B:
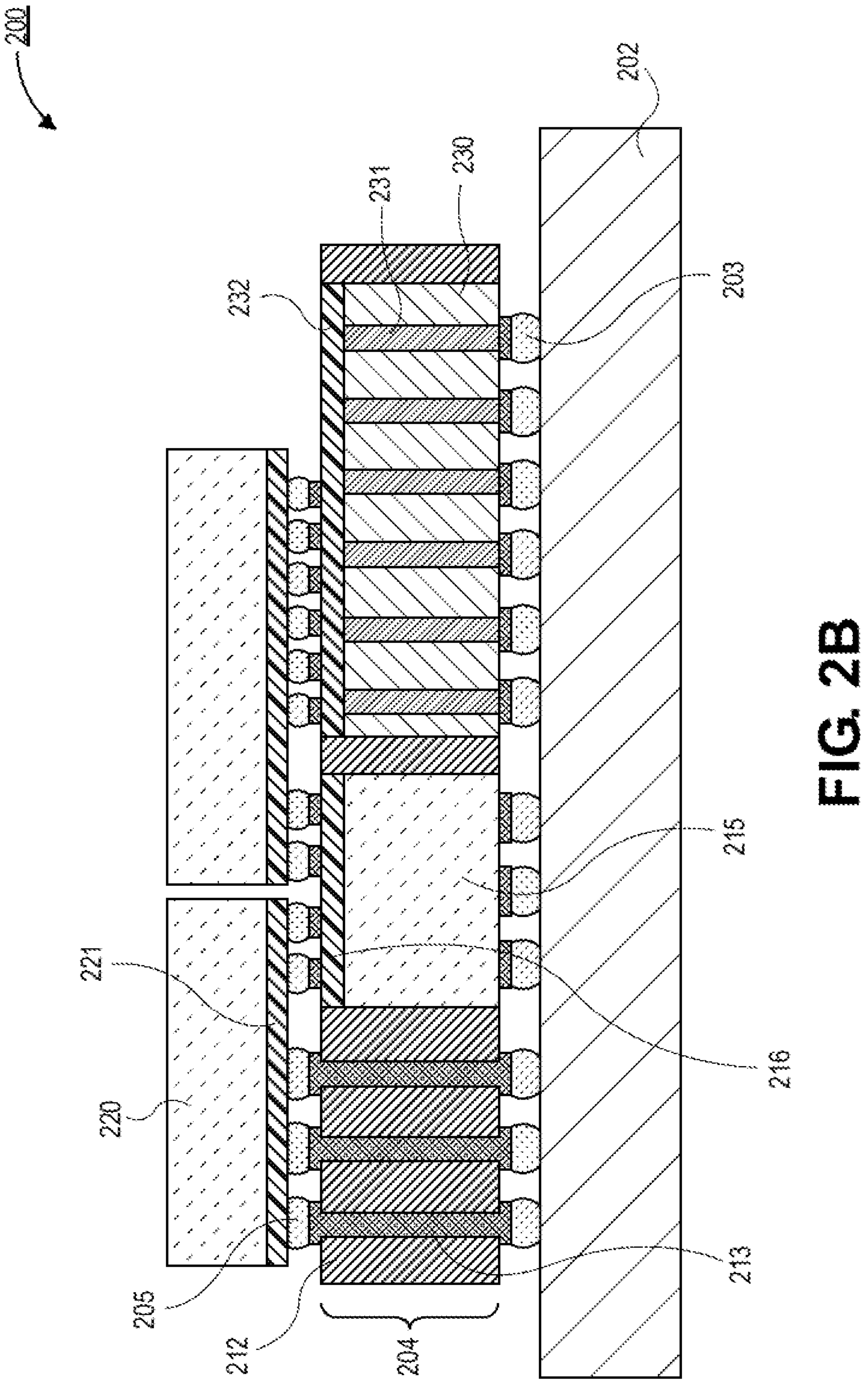
FIG. 2B is a cross-sectional illustration of an electronic package with a molded interposer that includes a glass via module that comprises a redistribution layer, in accordance with an embodiment.

Referring now to FIG. 2B, a cross-sectional illustration of an electronic package 200 is shown, in accordance with an additional embodiment. In an embodiment, the electronic package 200 in FIG. 2B may be substantially similar to the electronic package 200 in FIG. 2A, with the exception of the structure of the via module 230. In addition to the TGVs 231, the via module 230 may comprise a redistribution layer 232. The redistribution layer 232 may comprise one or more metal routing layers. As such, the signals can be fanned in or out in order to account for pitch differences between layers. In an embodiment, the redistribution layer 232 may be implemented in the glass of the via module 230. In other embodiments, dielectric layers may be laminated and patterned over the via module 230 in order to form the conductive routing. In addition to providing pitch translation, it is to be appreciated that the via module 230 may also comprise integrated passive devices. For example, capacitors, inductors, transformers, and the like may be integrated into the glass of the via module 230 or into the redistribution layer 232.

As those skilled in the art will appreciate, the patterning processes used to form the openings for the TGVs through the via module 230 are flexible to provide non-circular via shapes. For example, in the case of laser assisted etching, the laser can be moved in any desired pattern. In the case of photo-definable glass, the mask may be made in any pattern. Accordingly, embodiments disclosed herein provide the ability to form TGVs with shapes useful for certain power or signaling needs. FIGS. 3A-3F illustrate some of the patterns that may be useful for various purposes.

Figure 3A:
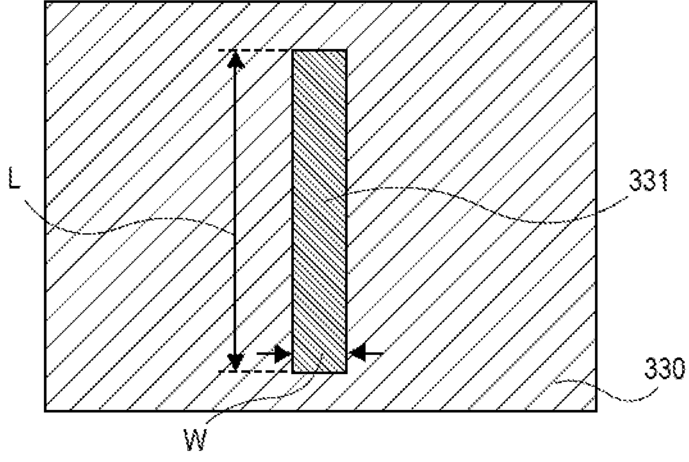
FIGS. 3A-3F are plan view illustrations of the glass via module with various via architectures, in accordance with various embodiments.

Referring now to FIG. 3A, a plan view illustration of a via module 330 and a TGV 331 is shown, in accordance with an embodiment. In an embodiment, the TGV 331 has a width W and a length L. As shown, the length L may be substantially longer than the width W. Such an embodiment may be suitable for providing power planes or shielding for other TGV 331 structures.

Figure 3B:
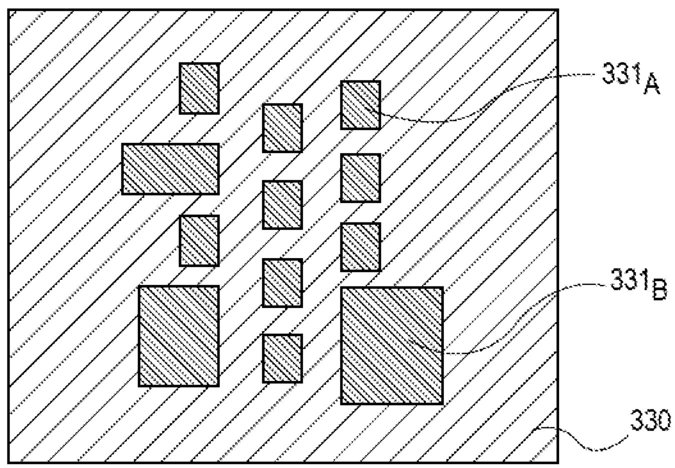

Referring now to FIG. 3B, a plan view illustration of a via module 330 is shown, in accordance with an additional embodiment. As shown, there may be a plurality of different sized TGVs 331. For example, smaller first TGVs $\mathbf{331}_A$ may be suitable for signaling purposes, and larger second TGVs $\mathbf{331}_B$ may be suitable for power delivery purposes.

Figure 3C:
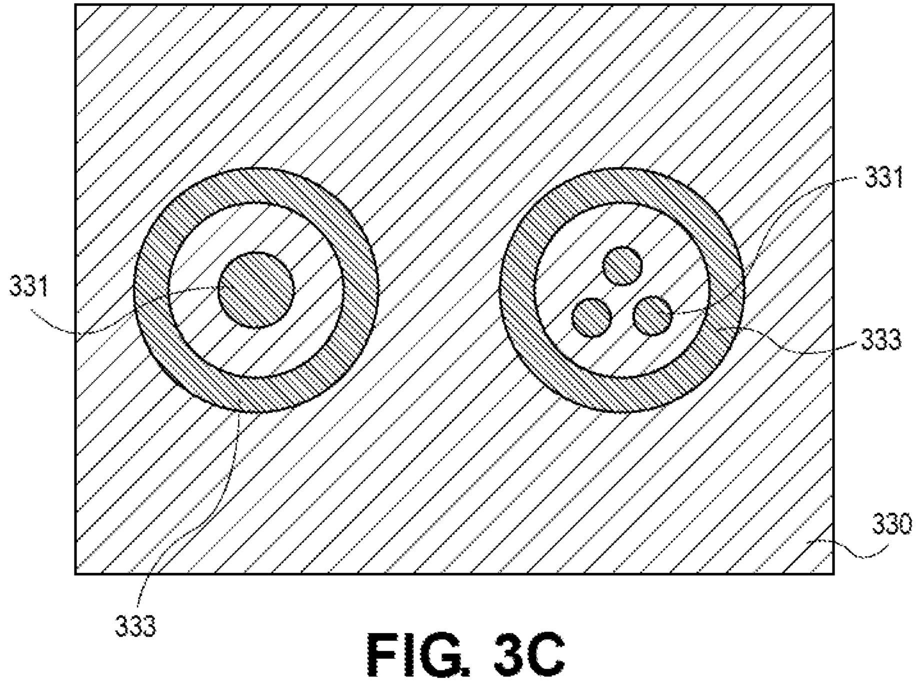

Referring now to FIG. 3C, a plan view illustration of a via module 330 is shown, in accordance with yet another embodiment. As shown, an outer shell 333 may be provided around a TGV 331. Both the outer shell 333 and the TGV 331 may pass through an entire thickness of the via module 330. Such an embodiment may be referred to as a coaxial TGV 331. This architecture improves shielding of the signal path, which may be beneficial for some signal types. Similarly, on the right side of the via module 330, another coaxial TGV 331 architecture is shown. In this embodiment, a plurality of TGVs 331 are within the outer shell 333. While three TGVs 331 are shown, it is to be appreciated that embodiments may include two or more TGVs 331 within the outer shell 333.

Figure 3D:
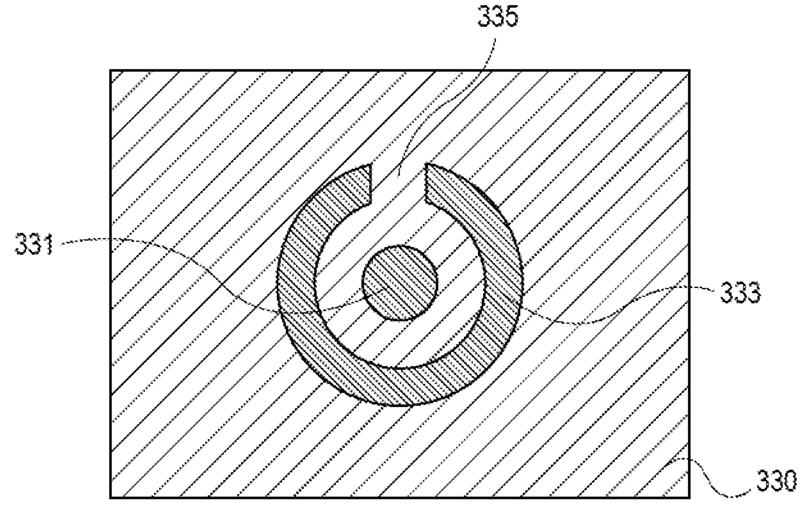

Referring now to FIG. 3D, a plan view illustration of a via module 330 is shown, in accordance with an embodiment. In an embodiment the via module 330 may include another type of coaxial TGV 331. However, instead of providing an outer shell 333 that is continuous around the inner TGV 331, a bridge 335 is provided across the outer shell 333. The bridge 335 may be useful in certain manufacturing processes. For example, when there is no underlying carrier used during the patterning of the openings for the TGV 331 and the outer shell 333, the bridge 335 allows for the interior region of glass to be connected to the glass outside of the outer shell 333. That is, the entire structure of the via module 330 may remain as a single piece during patterning.

Figure 3E:
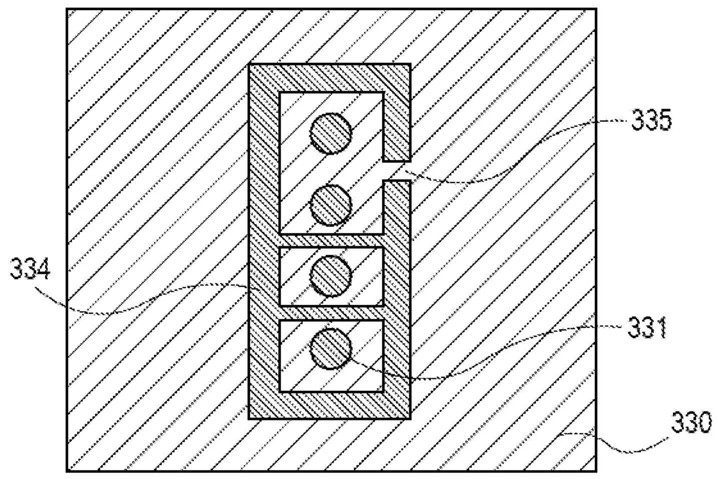

Referring now to FIG. 3E, a plan view illustration of a via module 330 is shown, in accordance with another embodiment. The via module 330 may also be considered a type of coaxial TGV 331. As shown, a plurality of TGVs 331 are surrounded by an outer frame 334. The frame 334 may have one or more bridges 335 for manufacturability (similar to the previous embodiment). In an embodiment, the frame 334 has openings for different signals. In the bottom two openings a single TGV 331 is provided, and in the top opening room for two TGVs 331 is provided.

Figure 3F:
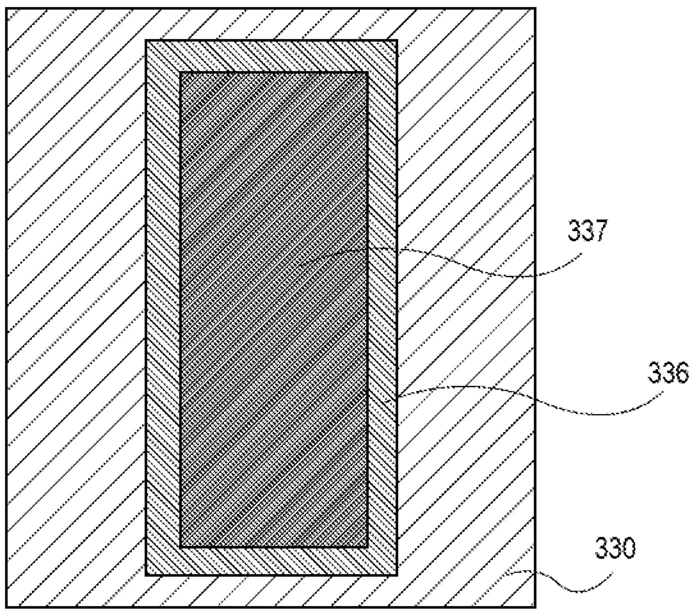

Referring now to FIG. 3F, a plan view illustration of a via module 330 is shown, in accordance with another embodiment. The via module 330 may include a via ring 336. The ring 336 may be formed in an opening that is too large to be reliably filled with conductive material. As such, the ring portion is plated around a perimeter of the opening. The remainder of the opening may be filled with a plugging material 337. The plugging material 337 may be an organic material with or without inorganic fillers. In some embodiments, the plugging material 337 may be part of the mold layer that is used to form the interposer in which the via module 330 will be embedded.

Referring now to FIGS. 4A-4I, a series of cross-sectional illustrations depicting a process for forming an electronic package similar to electronic packages described in greater detail above is shown, in accordance with an embodiment.

Figures 4A, 4B:
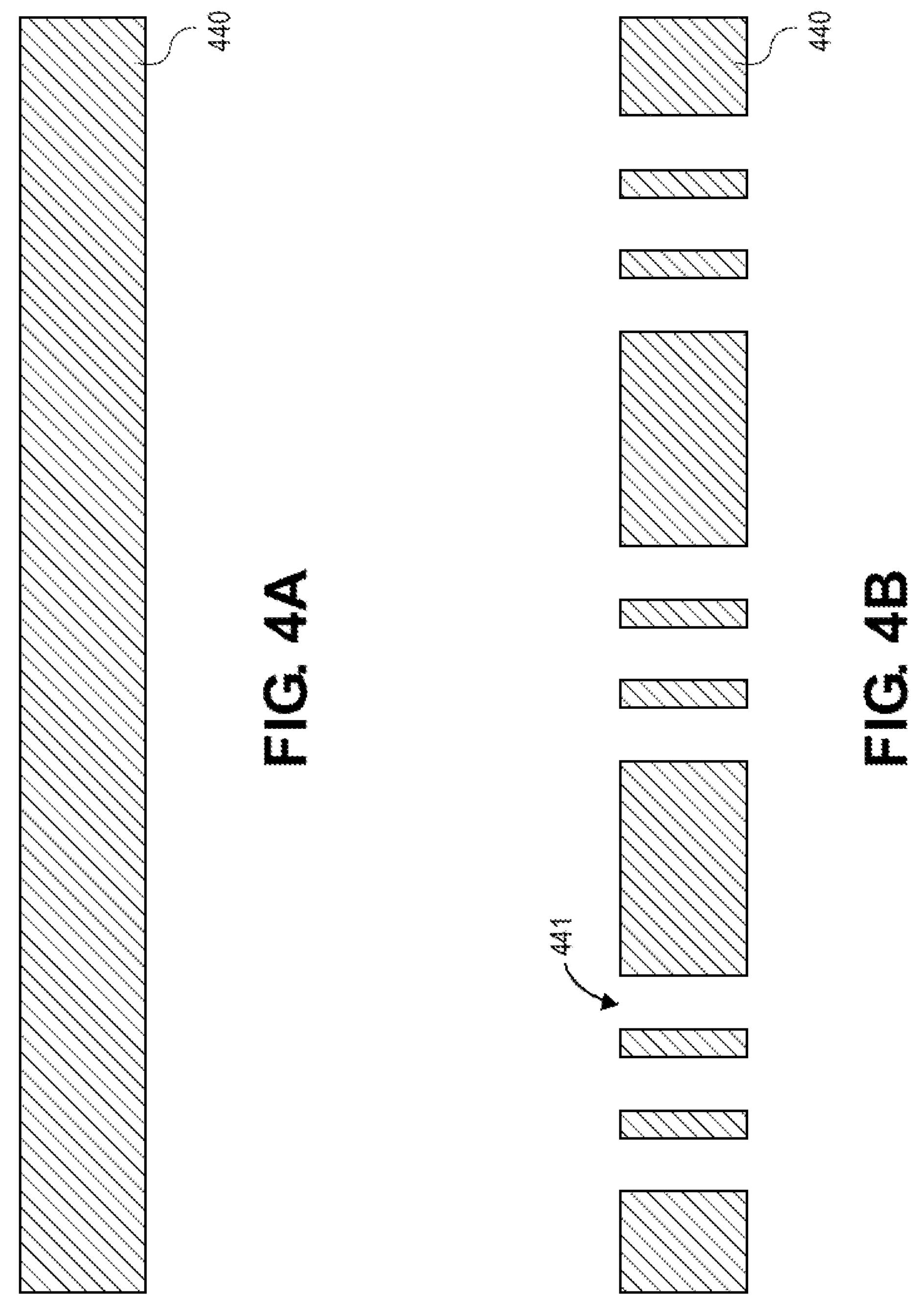
FIGS. 4A-4I are cross-sectional illustrations depicting a process for forming an electronic package with a glass via module embedded in a molded interposer, in accordance with an embodiment.

Referring now to FIG. 4A, a cross-sectional illustration of a substrate 440 is shown, in accordance with an embodiment. In an embodiment, the substrate 440 may be a glass substrate. The substrate 440 may be any form factor. For example, the substrate 440 may have a wafer level form factor, a quarter-panel level form factor, or a panel-level form factor. As such, a plurality of via modules may be fabricated in parallel with each other. Three via modules are illustrated in this process flow, but it is to be appreciated that any number (depending on size of the via module and the form factor used) may be fabricated substantially in parallel.

In an embodiment, the substrate 440 may be a glass substrate. The substrate 440 may have any suitable thickness. For example, the thickness of the substrate 440 may be substantially similar to the thickness of the interposer used in an electronic package. In a particular embodiment, the substrate 440 may have a thickness between approximately 50 μm and approximately 1,000 μm. Though, it is to be appreciated that smaller or larger thicknesses may be used in other embodiments. In one embodiment, the substrate 440 may be a glass suitable for laser assisted etching processes. In other embodiments, the substrate 440 may be a photo-definable glass suitable for direct lithographic patterning.

Referring now to FIG. 4B, a cross-sectional illustration of the substrate 440 after via openings 441 are formed is shown, in accordance with an embodiment. The patterning process to form the via openings 441 may include any suitable patterning regime. In particular embodiments, a laser assisted etching process or a photo-definable lithography process may be used. In the illustrated embodiment, the via openings 441 are shown as having substantially vertical sidewalls. However, it is to be appreciated that embodiments may include tapered or hourglass shaped profiles, depending on which patterning process is used. In the cross-sectional illustration shown, the via openings 441 all appear to be similar to tradition via structures. However, it is to be appreciated that the via openings 441 may accommodate any of the via architectures described in greater detail above.

In the embodiment illustrated in FIG. 4B, the substrate 440 is patterned without an underlying carrier. However, in other embodiments, a carrier may be provided below the substrate 440. Alternatively, the via openings 441 may not extend entirely through the substrate 440, and the bottom portion of the substrate 440 may function as the carrier. The residual bottom portion may then be thinned in a subsequent processing operation. While not necessary, providing a carrier may aid in the processing of thinner wafers or panels.

Additionally, a carrier may enable the creation of fully continuous metal shells (similar to the coaxial embodiments shown in FIG. 3C).

Figures 4C, 4D:
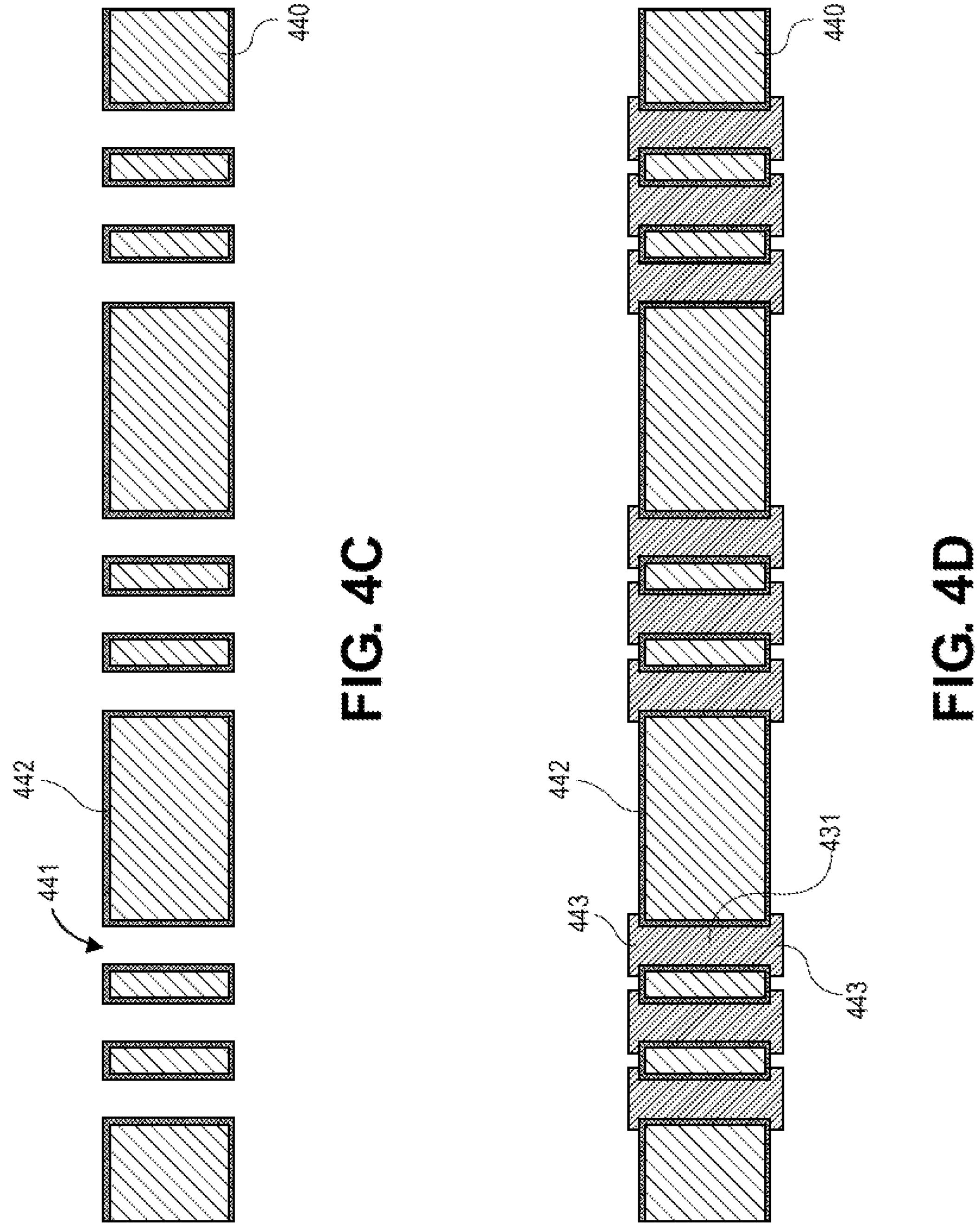

Referring now to FIG. 4C, a cross-sectional illustration of the substrate 440 after a seed layer 442 is formed is shown, in accordance with an embodiment. In an embodiment, the seed layer 442 may be any suitable material used in the deposition of the TGVs. For example, the seed layer 442 may comprise copper. The seed layer 442 may be deposited with any suitable deposition process. In an embodiment, the deposition process is a conformal deposition process, such as chemical vapor deposition (CVD), atomic layer deposition (ALD), or the like.

Referring now to FIG. 4D, a cross-sectional illustration of the substrate 440 after the TGVs 431 are plated is shown, in accordance with an embodiment. In an embodiment, the TGVs 431 may be plated with an electroplating process. Though other plating or deposition processes may also be used. In an embodiment, the plating process may include a patterning operation in order to form pads 443 above and below the TGVs 431. In an embodiment, the TGVs 431 may comprise copper or any other suitable conductive material.

Figures 4E, 4F:
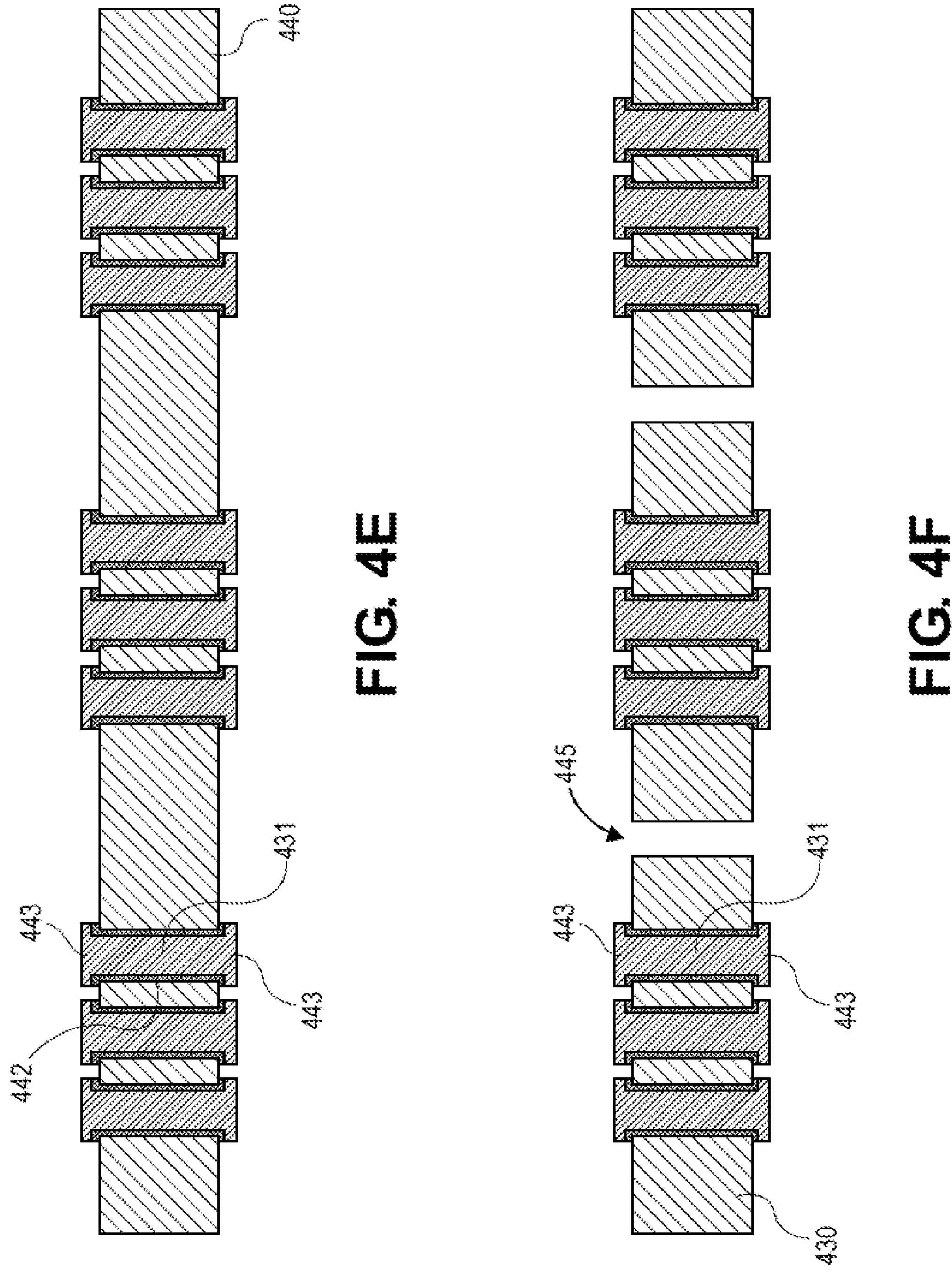

Referring now to FIG. 4E, a cross-sectional illustration of the substrate 440 after the seed layer 442 is removed is shown, in accordance with an embodiment. In an embodiment, the seed layer 442 may be removed with an etching process. The etching process may be a timed etching process in order to not over etch the pads 443.

Referring now to FIG. 4F, a cross-sectional illustration of the substrate 440 after singulation is shown, in accordance with an embodiment. In an embodiment, the singulation may result in trenches 445 that pass through the thickness of the substrate 440. Via modules 430 are formed as a result of the singulation process. For example, three via modules 430 are shown in FIG. 4F. In an embodiment, the singulation process may be a mechanical sawing process, a laser drilling process, a lithography process, or the like.

Figure 4G:
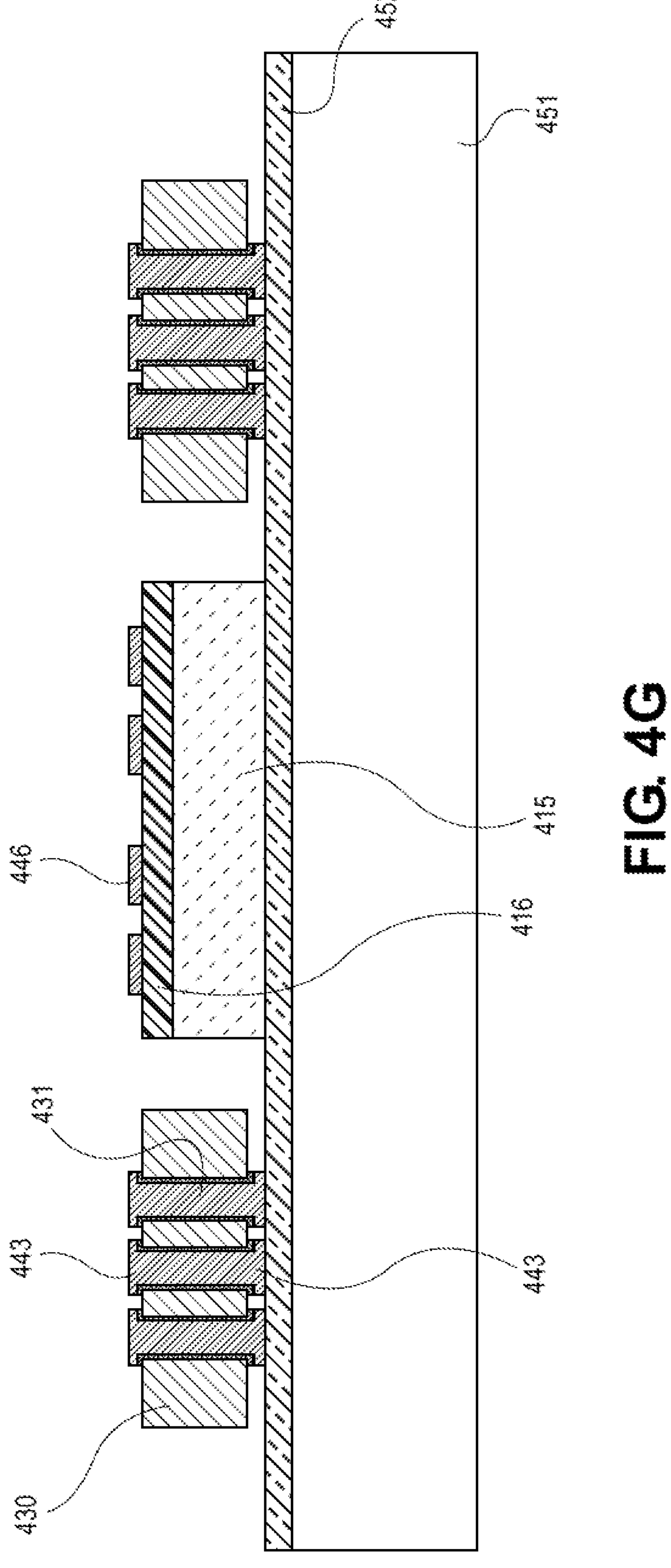

Referring now to FIG. 4G, a cross-sectional illustration of a carrier 451 is shown, in accordance with an embodiment. The carrier 451 may be a glass carrier or the like. In an embodiment, a pair of via modules 430 are attached to the carrier 452 by an adhesive layer 452. The adhesive layer 452 may be a UV deactivated adhesive layer. That is, exposure to UV light results in the adhesive layer 452 releasing the overlying structure. In an embodiment, a die 415 may also be adhered to the carrier 451. The die 415 may have a surface 416 with conductive routing and pads 446. The surface 416 may be oriented away from the carrier 451. In an embodiment, the die 415 may be a bridge die used to electrically couple together overlying dies (added in a subsequent processing operation).

Figure 4H:
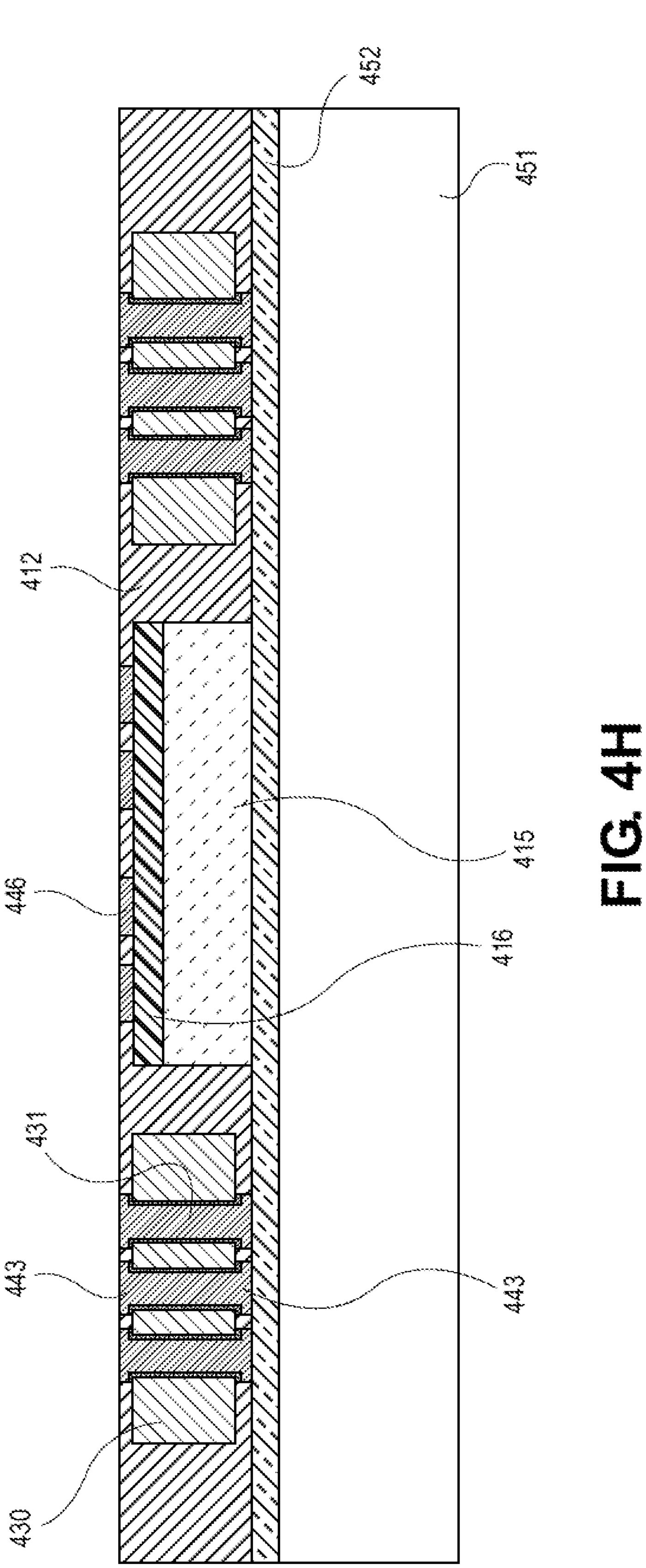

Referring now to FIG. 4H, a cross-sectional illustration of the carrier after a mold layer 412 is applied over the via modules 430 and the die 415 is shown, in accordance with an embodiment. In an embodiment, an overmolding and curing process may be used to form the mold layer 412. A polishing process (e.g., chemical mechanical polishing (CMP)) may be used to recess the mold layer 412 and expose the pads 443 and 446.

In embodiments that include standard TDVs, the TDVs may be formed through the mold layer 412 at this point. Though, it is to be appreciated that no TDVs are illustrated in the cross section of FIG. 4H. In an embodiment, first level interconnect (FLI) bumping (e.g., lithography and plating of FLI microbumps) may also be completed at this stage of manufacture.

Figure 4I:
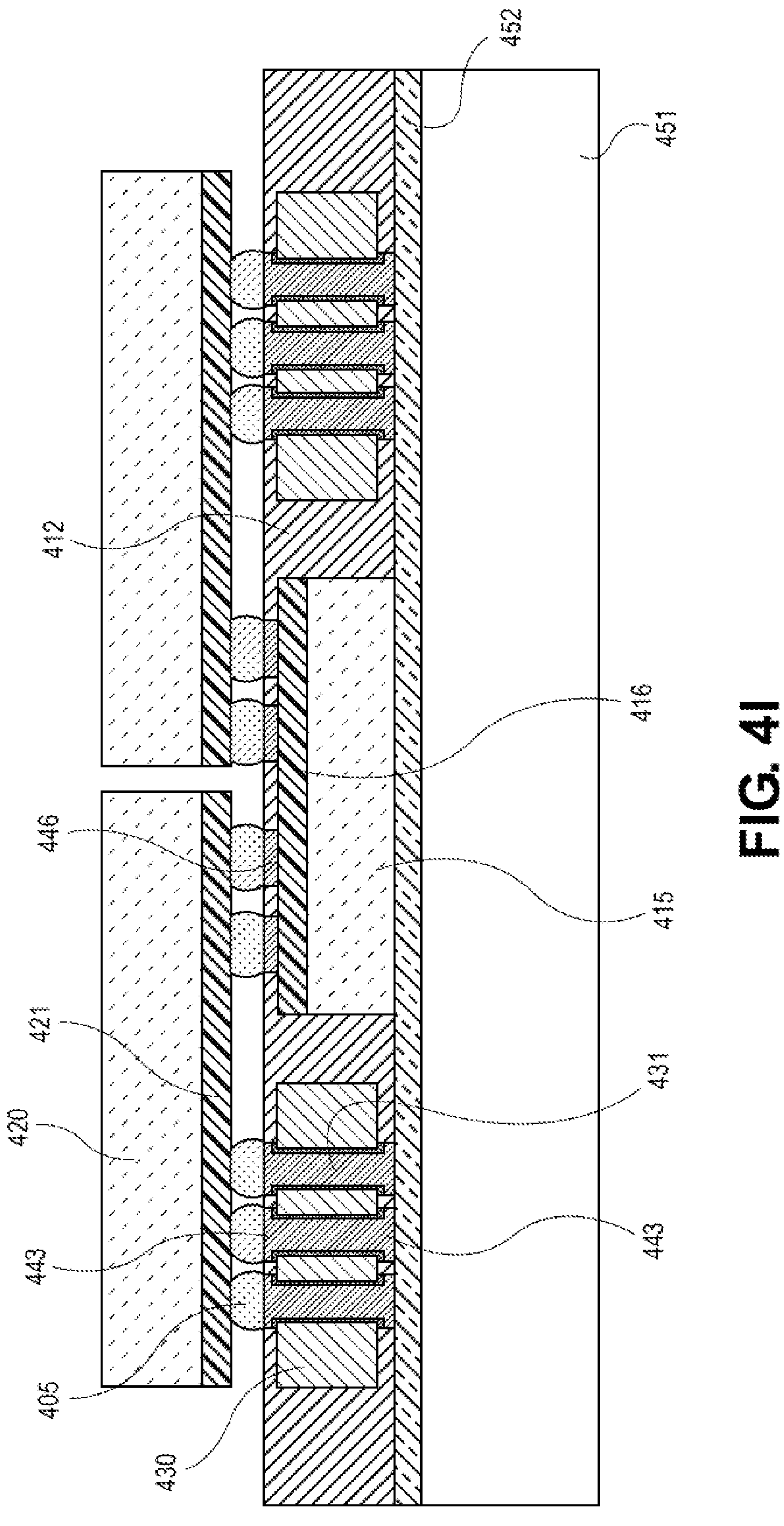

Referring now to FIG. 4I, a cross-sectional illustration of the structure after top dies 420 are attached to the mold layer 412 is shown, in accordance with an embodiment. FLI bumps 405 may couple the active surfaces 421 of the top dies 420 to the pads 443 and 446 of the via modules 430 and the die 415. After the top dies 420 are attached, standard processing operations may be implemented to finish the electronic package. For example, dicing, removal from the carrier 451, solder bump plating on the package side of the die module, and package attach may be implemented after the processing shown in FIG. 4I.

Figure 5:
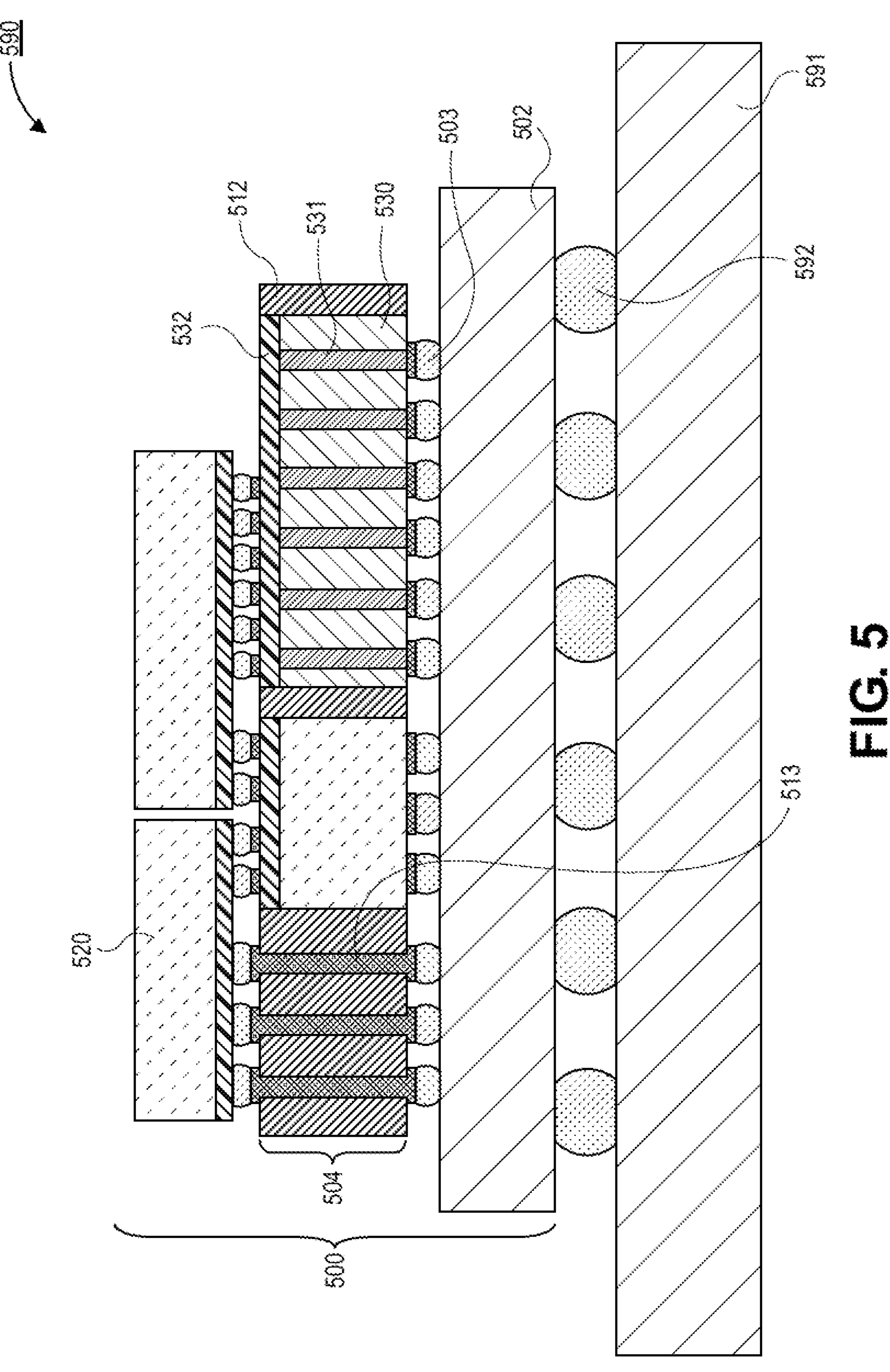
FIG. 5 is a cross-sectional illustration of an electronic system with a molded interposer that comprises a glass via module, in accordance with an embodiment.

Referring now to FIG. 5, a cross-sectional illustration of an electronic system 590 is shown, in accordance with an embodiment. In an embodiment, the electronic system 590 may comprise a board 591 (e.g., a printed circuit board (PCB)). The board 591 may be coupled to the electronic package 500 by interconnects 592. While solder balls are depicted as the interconnects 592, it is to be appreciated that any interconnect architecture may be used (e.g., sockets, etc.). In an embodiment, the electronic package 500 comprises an interposer 504 that is coupled to the package substrate 502 by interconnects 503. In an embodiment, the interposer 504 comprises a mold layer 512. TDVs 513 may be provided through the mold layer 512. Additionally, a via module 530 may be embedded in the mold layer 512. The via module 530 may comprise TGVs 531 and a redistribution layer 532. The electronic package 500 may also comprise top dies 520.

In the Figures described above, the interposers comprise via modules that are embedded in mold layers. However, in additional embodiments, the interposer may comprise a glass substrate instead of a mold layer. Glass substrates may allow for higher density TGVs. Additionally, blind patterning processes may allow for dies to be embedded within the glass interposer.

Figure 6A:
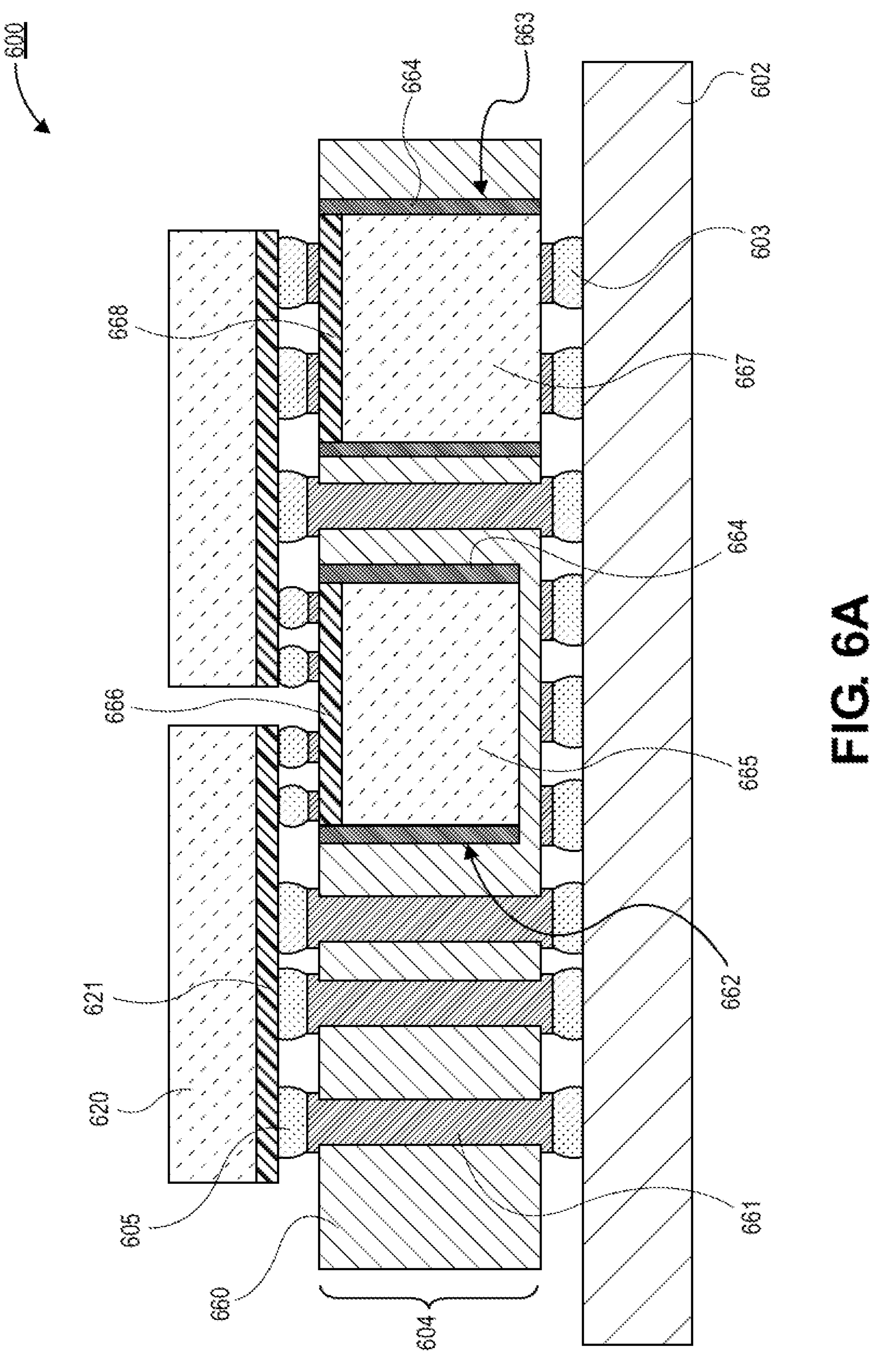
FIG. 6A is a cross-sectional illustration of an electronic package with a glass interposer that comprises a blind cavity and a through cavity for embedded dies, in accordance with an embodiment.

Referring now to FIG. 6A, a cross-sectional illustration of an electronic package 600 is shown, in accordance with an embodiment. In an embodiment, the electronic package 600 comprises a package substrate 602. The package substrate 602 may comprise conductive routing (not shown) in order to couple the die module to an underlying board (not shown). In an embodiment, the package substrate 602 may be coupled to the die module by interconnects 603.

In an embodiment, the die module may comprise an interposer 604. The interposer 604 may be a glass substrate 660. In an embodiment, the TGVs 661 may pass through a thickness of the glass substrate 660. Additionally, one or more dies may be embedded in the glass substrate 660. For example, a first die 665 may be embedded in a blind via opening 662 into the glass substrate 660. A dielectric material 664 (e.g., an organic material) may fill the remainder of the blind via opening 662 in order to secure the first die 665 in the blind via opening 662. In an embodiment, a redistribution layer 666 of the first die 665 may face the top dies 620. The first die 665 may be a bridge die that couples together the top dies 620. The active surfaces 621 of the top dies 620 may face the interposer 604 and be connected to the interposer by interconnects 605.

In an embodiment, the die module may further comprise a second die 667 that is embedded in the glass substrate 660. The second die 667 may be in a via opening 663 that passes entirely through a thickness of the glass substrate 660. A redistribution layer 668 may be provided over the second die 667 facing the top dies 620. Similar to the first die 665, an organic dielectric material 664 may fill the remainder of the via opening 663 in order to secure the second die 667 in the via opening 663.

Figure 6B:
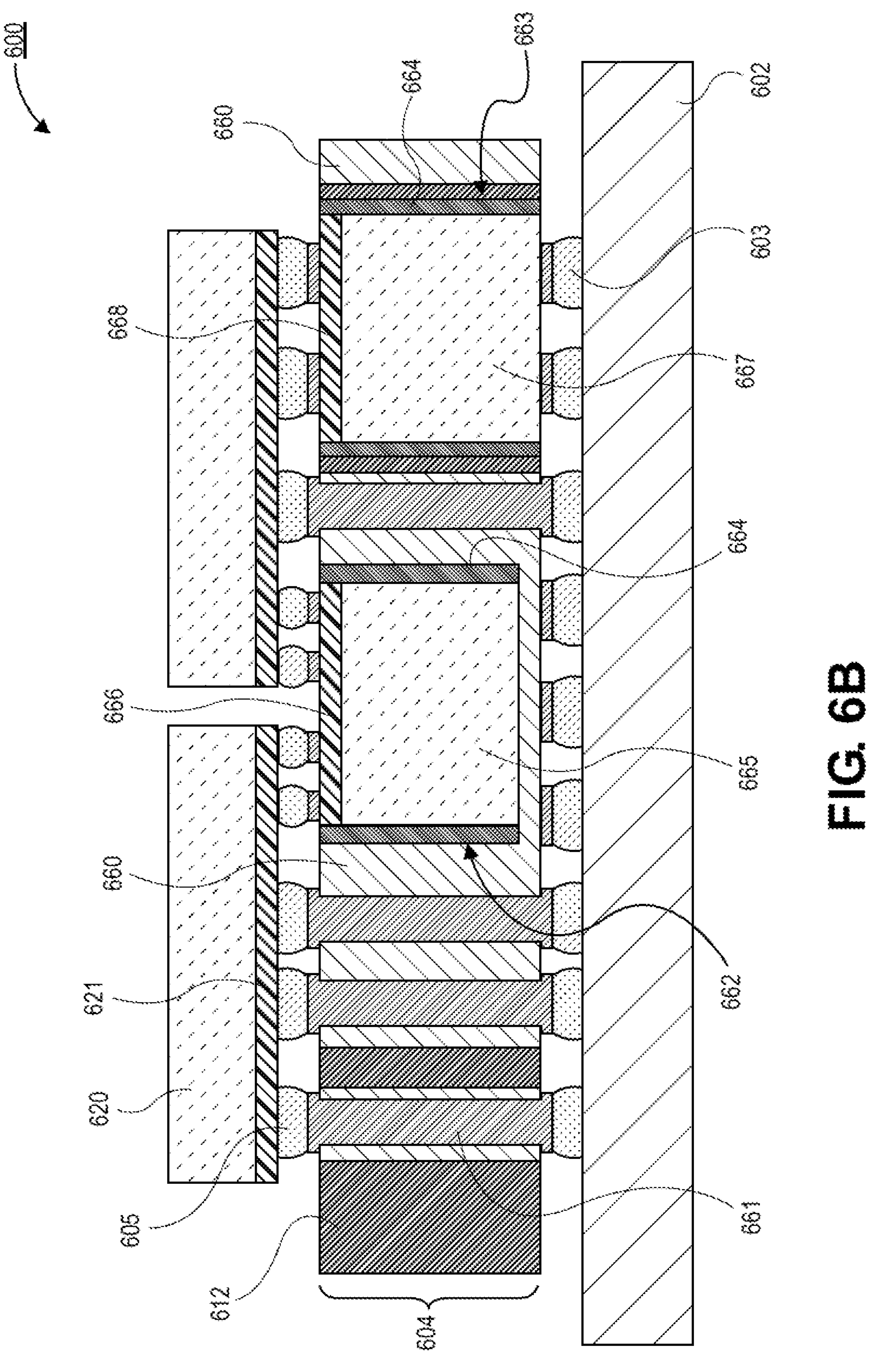
FIG. 6B is a cross-sectional illustration of an electronic package with a glass interposer that comprises cutouts that are filled with a mold material to control CTE, in accordance with an embodiment.

Referring now to FIG. 6B, a cross-sectional illustration of an electronic package 600 is shown, in accordance with an additional embodiment. The electronic package 600 in FIG. 6B may be substantially similar to the electronic package 600 in FIG. 6A, with the exception of the interposer 604. Instead of having an interposer 604 that is all glass substrate 660, portions of the interposer 604 may comprise mold material 612. The inclusion of some mold regions may help provide a mechanical transition in the interposer 604 in order to reduce die stresses or control the package warpage during die to package or package to board attachment.

Figure 7B:
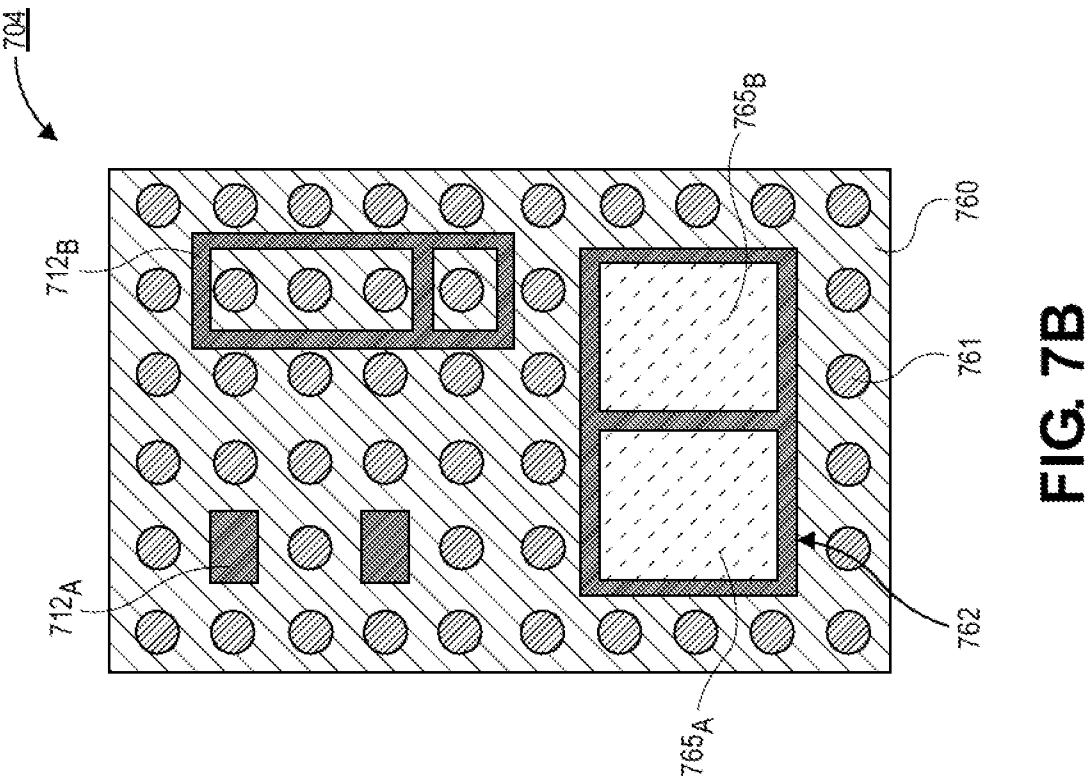
FIG. 7B is a plan view illustration of a glass interposer with cavities and cutouts, in accordance with an embodiment.
Figure 7A:
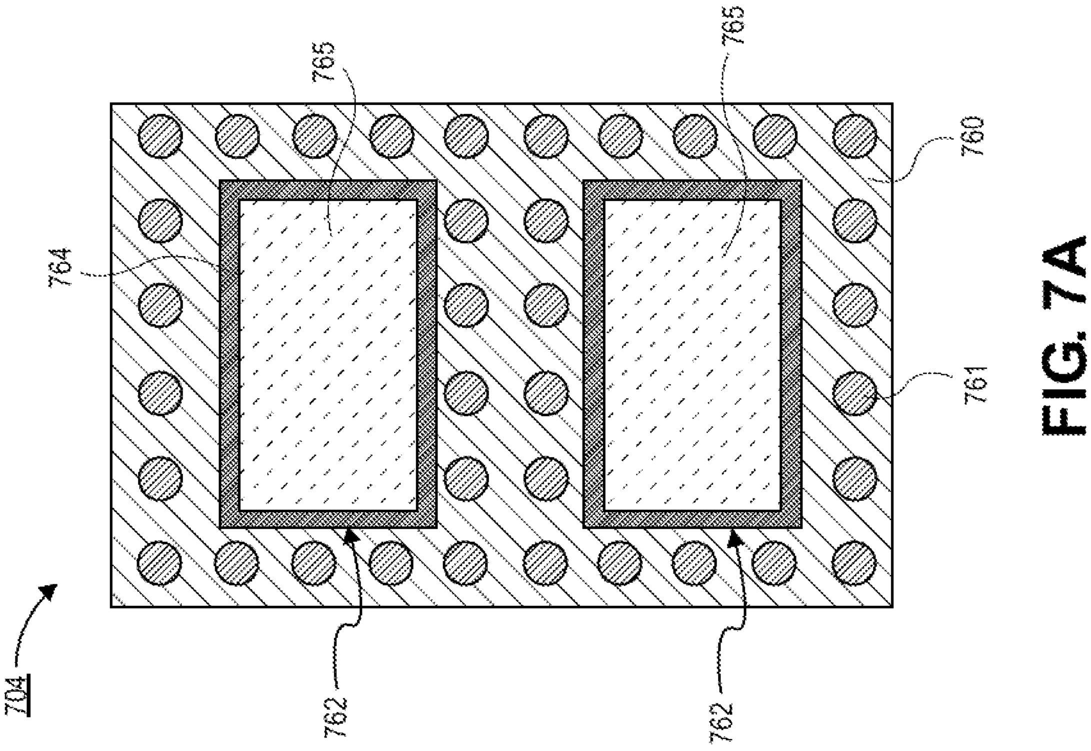
FIG. 7A is a plan view illustration of a glass interposer with cavities for embedding dies, in accordance with an embodiment.

Referring now to FIGS. 7A and 7B, plan view illustrations of the interposer are shown, in accordance with various embodiments. The interposer 704 in FIG. 7A may be substantially similar to the interposer 604 in FIG. 6A, and the interposer 704 in FIG. 7B may be substantially similar to the interposer 604 in FIG. 6B.

Referring now to FIG. 7A, a plan view illustration of the interposer 704 is shown, in accordance with an embodiment. As shown, the interposer 704 may comprise a plurality of TGVs 761 on a glass substrate 760. Additionally via openings 762 may be formed into the interposer 704. Dies 765 may be placed in the via openings 762. The via openings 762 may be further filled with a mold material 764 or the like in order to secure the dies 765 in the via openings 762.

Referring now to FIG. 7B, a plan view illustration of an interposer 704 is shown, in accordance with an additional embodiment. In the illustrated embodiment, a pair of dies 765A and 765B are provided in a single via opening 762. That is, a plurality of dies 765 may be provided in a single via opening 762 in some embodiments. In an embodiment, the interposer 704 may further comprise cutouts 712. The cutouts 712 may be filled with mold material or the like. In an embodiment, the cutouts 712A may be between TGVs 761. In other instances, cutouts 712E may surround TGVs 761. As noted above, the inclusion of some mold regions in the cutouts 712A and 712E may help provide a mechanical transition in the interposer 704 in order to reduce die stresses or control the package warpage during die to package or package to board attachment.

Figure 8A:
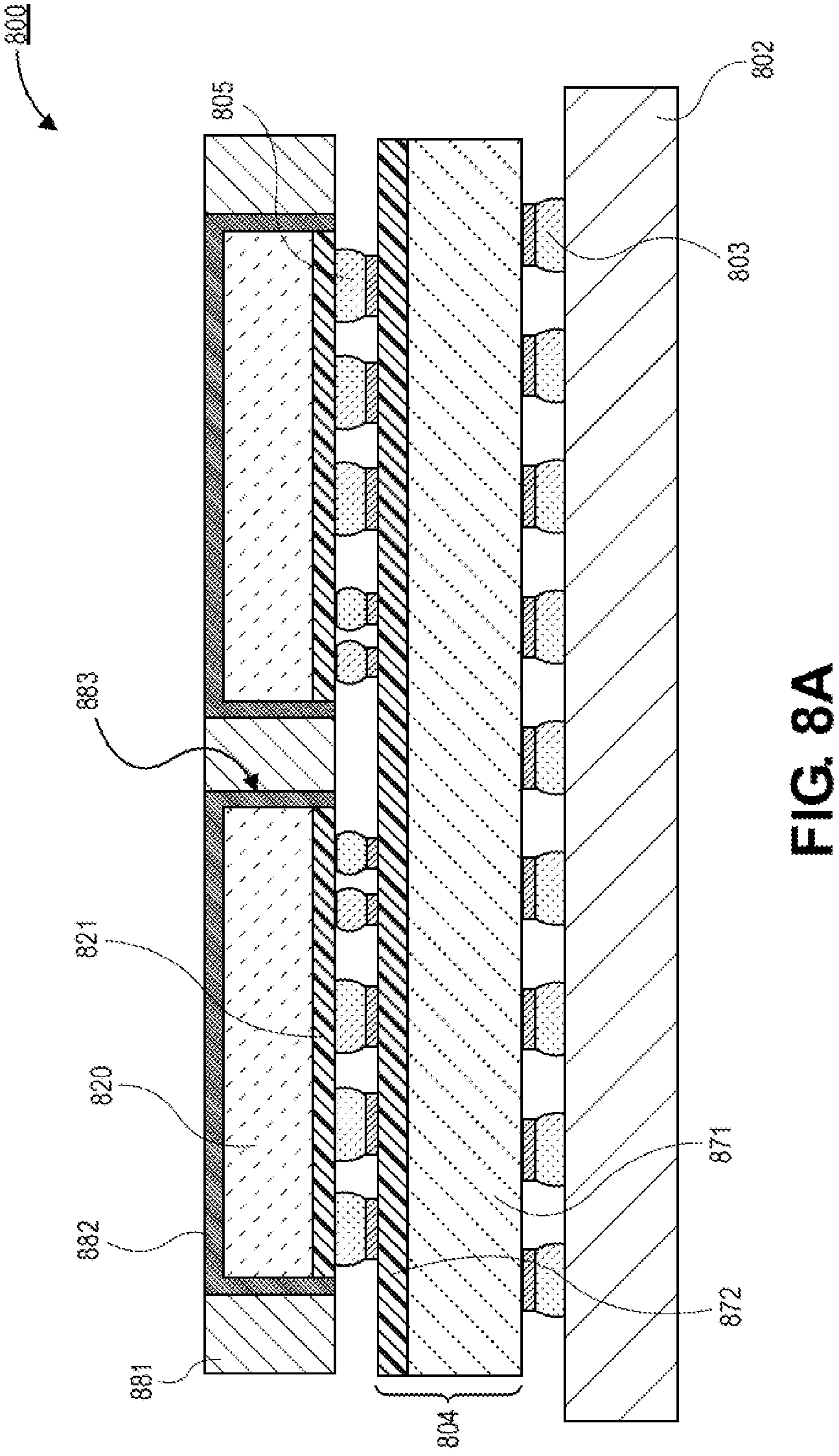
FIG. 8A is a cross-sectional illustration of an electronic package with a glass overmold over the top dies, in accordance with an embodiment.
Figure 8B:
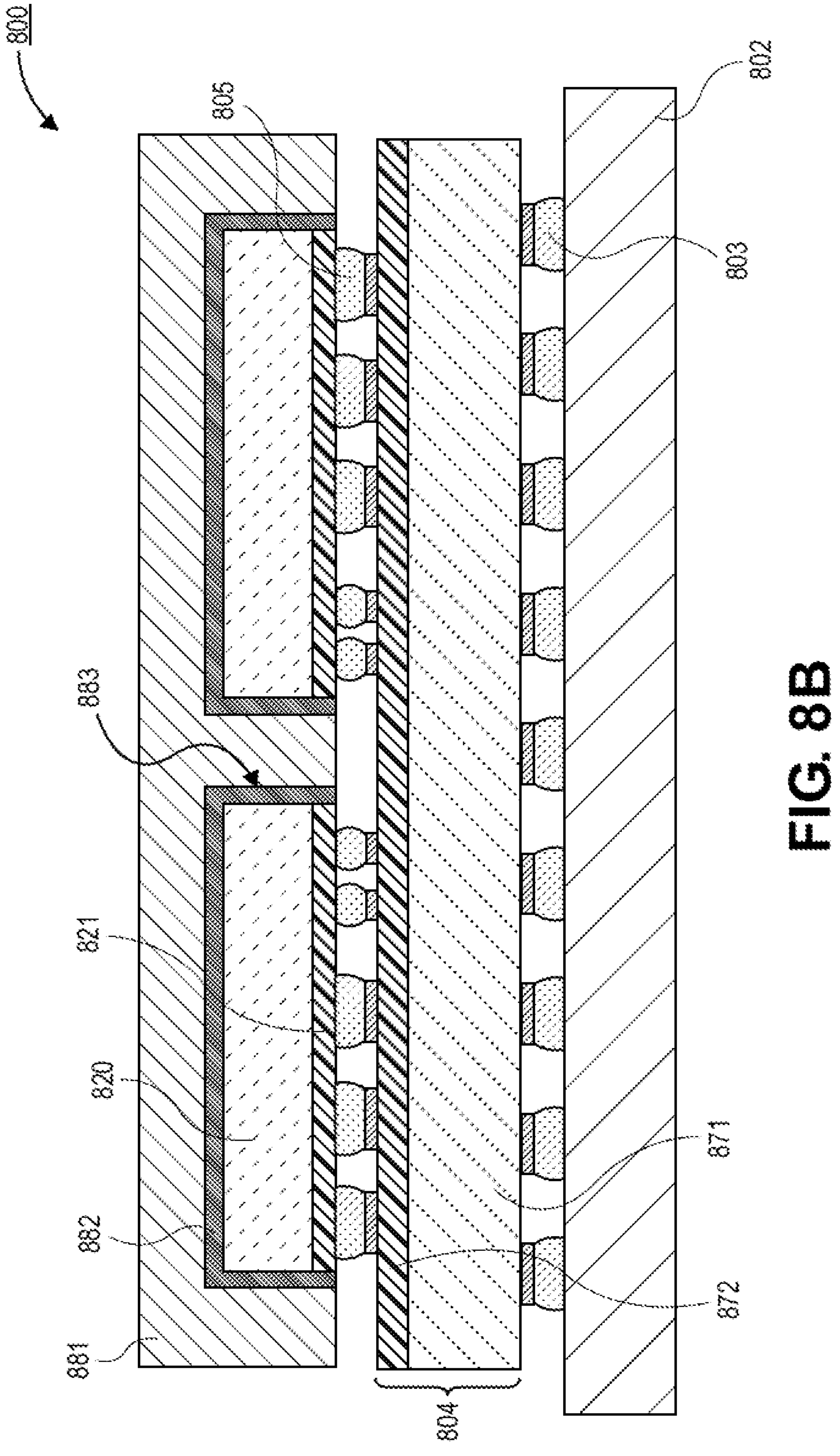
FIG. 8B is a cross-sectional illustration of an electronic package with a glass overmold with blind cavities for the dies, in accordance with an embodiment.

Referring now to FIGS. 8A and 8B, cross-sectional illustrations of electronic packages 800 are shown, in accordance with additional embodiments. In the embodiments shown in FIGS. 8A and 8B, the interposer 804 comprises an inorganic substrate 871, such as a silicon substrate. The top dies 820 may be overmolded with a glass substrate 881.

Referring now to FIG. 8A, a cross-sectional illustration of an electronic package 800 is shown, in accordance with an embodiment. The electronic package 800 may comprise a package substrate 802. The package substrate 802 may be coupled to an interposer 804 by interconnects 803. In an embodiment, the interposer 804 may comprise an inorganic material, such as a silicon substrate 871. In an embodiment, vias (not shown) may pass through the silicon substrate 871. A redistribution layer 872 of the silicon substrate 871 may be coupled to the active surface 821 of the top dies 820 by interconnects 805. While shown as a silicon substrate 871, it is to be appreciated that the interposer 804 may comprise any of the interposer architectures described in greater detail above. That is, the interposer 804 may be a mold layer with via modules, or a glass substrate.

In an embodiment, the top dies 820 may be surrounded by a glass substrate 881. The glass substrate 881 may comprise via openings 883. The top dies 820 may be inserted through the via openings 883. In an embodiment, a mold material 882 or the like may secure the top dies 820 in the via openings 883. In some embodiments, the backside surface (i.e., top surface in FIG. 8A) may also be covered with the mold material 882.

Referring now to FIG. 8B, a cross-sectional illustration of an electronic package 800 is shown, in accordance with an additional embodiment. In an embodiment, the electronic package 800 in FIG. 8B may be substantially similar to the electronic package 800 in FIG. 8A, with the exception of the glass layer 881. Instead of having through via openings, the glass layer 881 may have blind via openings 883. As such, the glass layer 881 may cover the backside surfaces of the top dies 820.

Referring now to FIGS. 9A-9H, a series of cross-sectional illustrations depicting a process for forming electronic packages with a glass interposer is shown, in accordance with an embodiment. The electronic package fabricated in FIGS. 9A-9H may be substantially similar to the electronic package 600 in FIG. 6A.

Figures 9A, 9B:
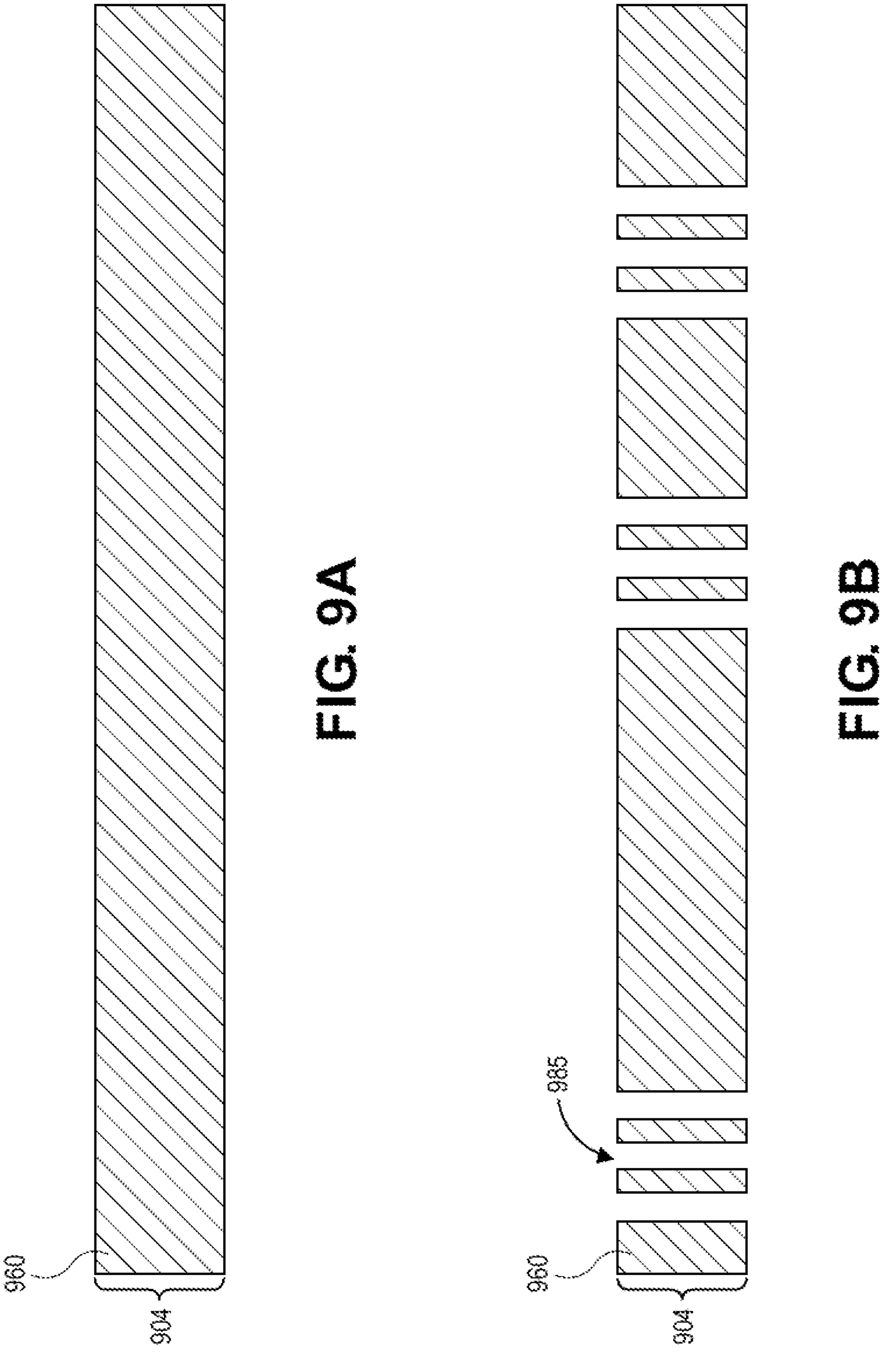
FIGS. 9A-9H are cross-sectional illustrations depicting a process for forming a glass interposer with cavities for embedding dies, in accordance with an embodiment.

Referring now to FIG. 9A, a cross-sectional illustration of an interposer 904 is shown, in accordance with an embodiment. In an embodiment, the interposer 904 may comprise a glass substrate 960. In an embodiment, the glass substrate 960 may be a material that can be patterned with a laser assisted etching process, or a photo-definable material. The glass substrate 960 may have a thickness that is between approximately 50 μm and approximately 1,000 μm.

Referring now to FIG. 9B, a cross-sectional illustration of the interposer 904 after via openings 985 are formed through the glass substrate 960 is shown, in accordance with an embodiment. The via openings 985 may be formed with a laser assisted etching process or a photolithography process. In the illustrated embodiments, the vias 985 have substantially vertical sidewalls. However, it is to be appreciated that the vias 985 may have tapered sidewalls or an hourglass shaped profile, depending on the patterning process used to form the via openings 985.

Figures 9C, 9D:
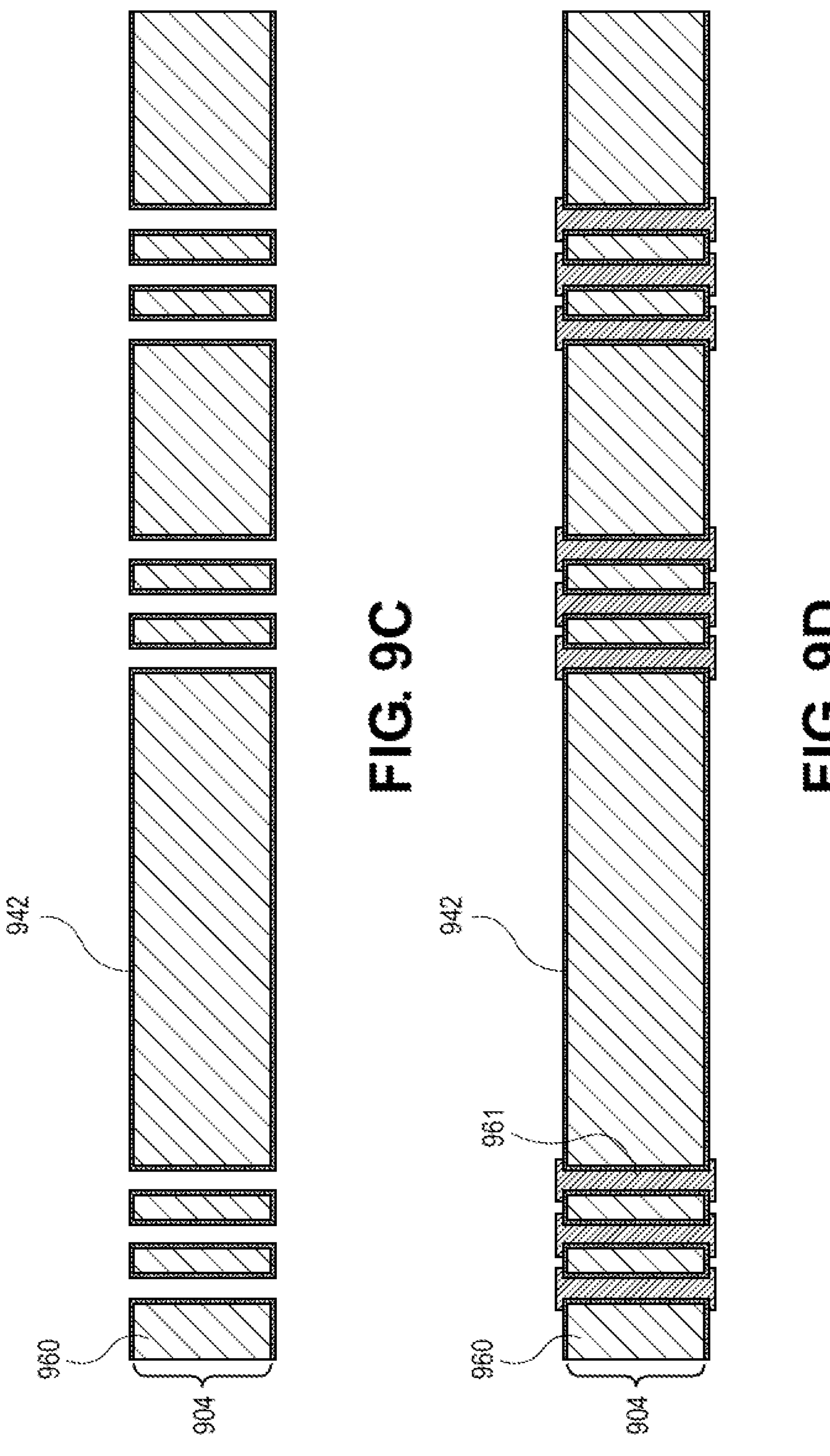

Referring now to FIG. 9C, a cross-sectional illustration of the interposer 904 after a seed layer 942 is disposed over the surface of the glass substrate 960 is shown, in accordance with an embodiment. In an embodiment, the seed layer 942 may be any suitable material used in the deposition of the TGVs. For example, the seed layer 942 may comprise copper. The seed layer 942 may be deposited with any suitable deposition process. In an embodiment, the deposition process is a conformal deposition process, such as CVD, ALD, or the like.

Referring now to FIG. 9D, a cross-sectional illustration of the interposer 904 after TGVs 961 are plated, is shown, in accordance with an embodiment. In an embodiment, the TGVs 961 may be plated with an electroplating process. Though other plating or deposition processes may also be used. In an embodiment, the plating process may include a patterning operation in order to form pads above and below the TGVs 961. In an embodiment, the TGVs 961 may comprise copper or any other suitable conductive material.

Figures 9E, 9F:
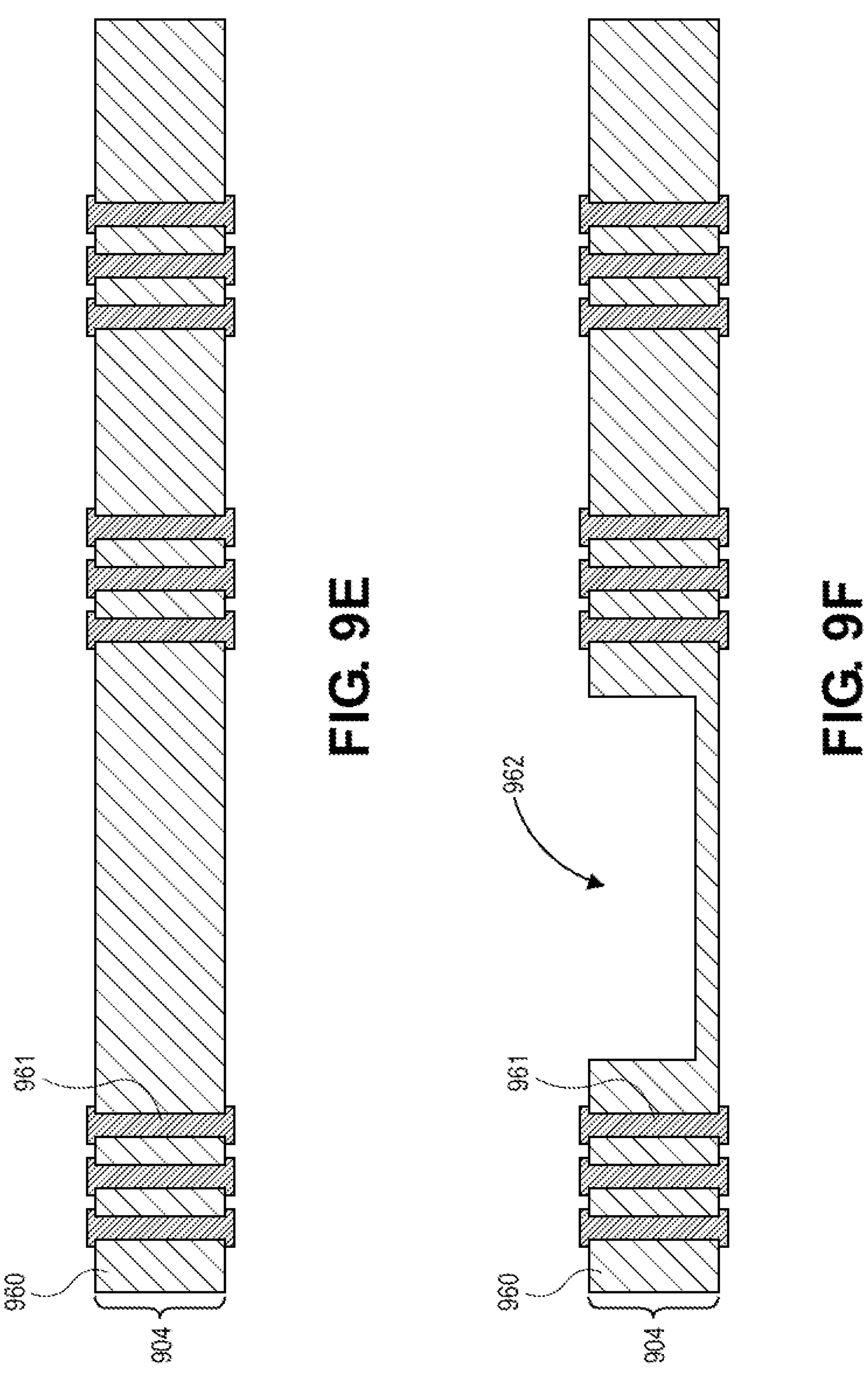

Referring now to FIG. 9E, a cross-sectional illustration of the interposer 904 after the seed layer 942 is removed is shown, in accordance with an embodiment. In an embodiment, the seed layer 942 may be removed with a timed etching process. In some instances, the seed layer 942 removal etch may be referred to as a flash etching process.

Referring now to FIG. 9F, a cross-sectional illustration after a blind via opening 962 is formed into the glass core 960 is shown, in accordance with an embodiment. The blind via opening 962 may be formed with any suitable etching process, such as those described above. In the illustrated embodiment, the sidewalls of the blind via opening 962 are substantially vertical. However, in other embodiments, the sidewalls of the blind via opening 962 may be tapered.

Figures 9G, 9H:
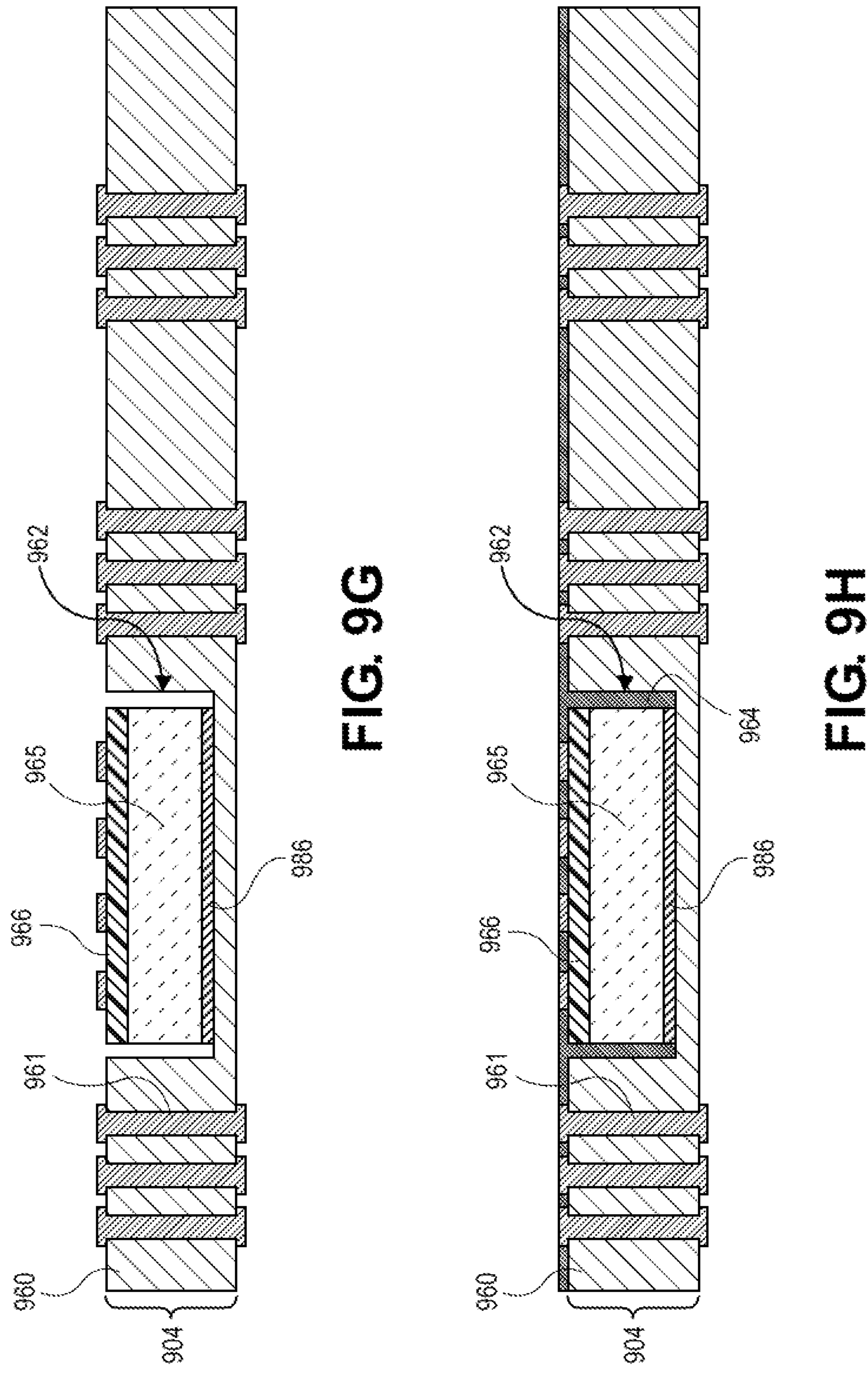

Referring now to FIG. 9G, a cross-sectional illustration of the interposer 904 after a die 965 is disposed in the blind via opening 962 is shown, in accordance with an embodiment. In an embodiment, the backside surface of the die 965 may be adhered to the glass substrate 960 with an adhesive layer 986. The redistribution layer 966 may be facing up away from the bottom of the blind via opening 962.

Referring now to FIG. 9H, a cross-sectional illustration of the interposer 904 after a fill material 964 is disposed around the sidewalls and over the top surface of the die 965 is shown, in accordance with an embodiment. The fill material 964 may be an organic material, such as a mold material.

Figure 10:
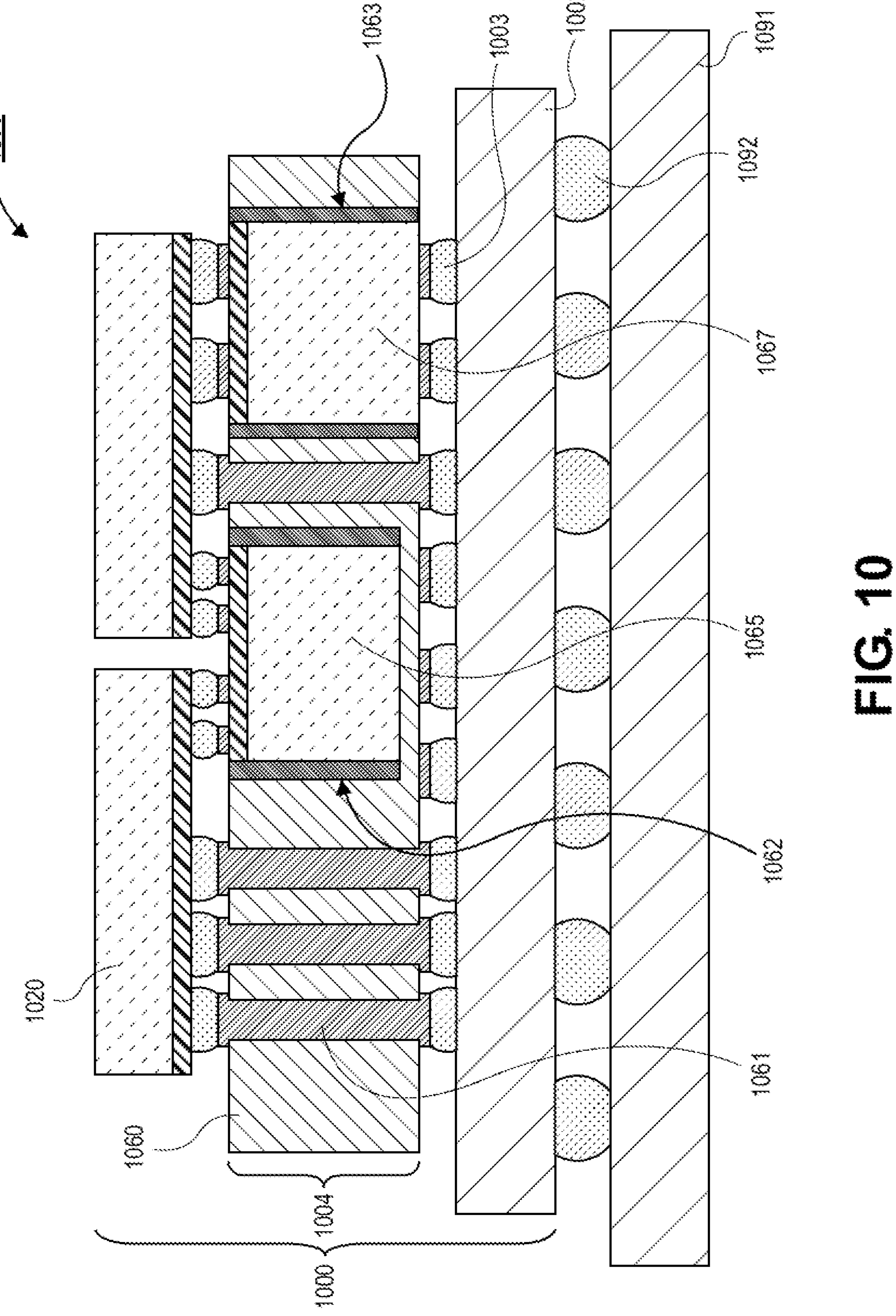
FIG. 10 is a cross-sectional illustration of an electronic system with a glass interposer with embedded dies and vias, in accordance with an embodiment.

Referring now to FIG. 10, a cross-sectional illustration of an electronic system 1090 is shown, in accordance with an embodiment. In an embodiment, the electronic system 1090 may comprise a board 1091, such as a PCB. The board 1091 may be coupled to an electronic package 1000 by interconnects 1092. The interconnects 1092 are shown as solder interconnects, but it is to be appreciated that any interconnect architecture may be used (such as sockets or the like). In the illustrated embodiment, the electronic package 1000 is substantially similar to the electronic package 600 in FIG. 6A. However, it is to be appreciated that any of the electronic package architectures described herein may be included in the electronic system 1090.

In an embodiment, the electronic package 1000 may comprise a package substrate 1002. The package substrate 1002 may be coupled to an interposer 1004 by interconnects 1003, such as solder or the like. In an embodiment, the interposer 1004 may comprise a glass substrate 1060. TGVs 1061 may be formed through the glass substrate 1060. Additionally, a blind via opening 1062 and a through via opening 1063 may accommodate dies 1065 and 1067, respectively. Top dies 1020 may be coupled to the interposer 1004 as well.

Figure 11:
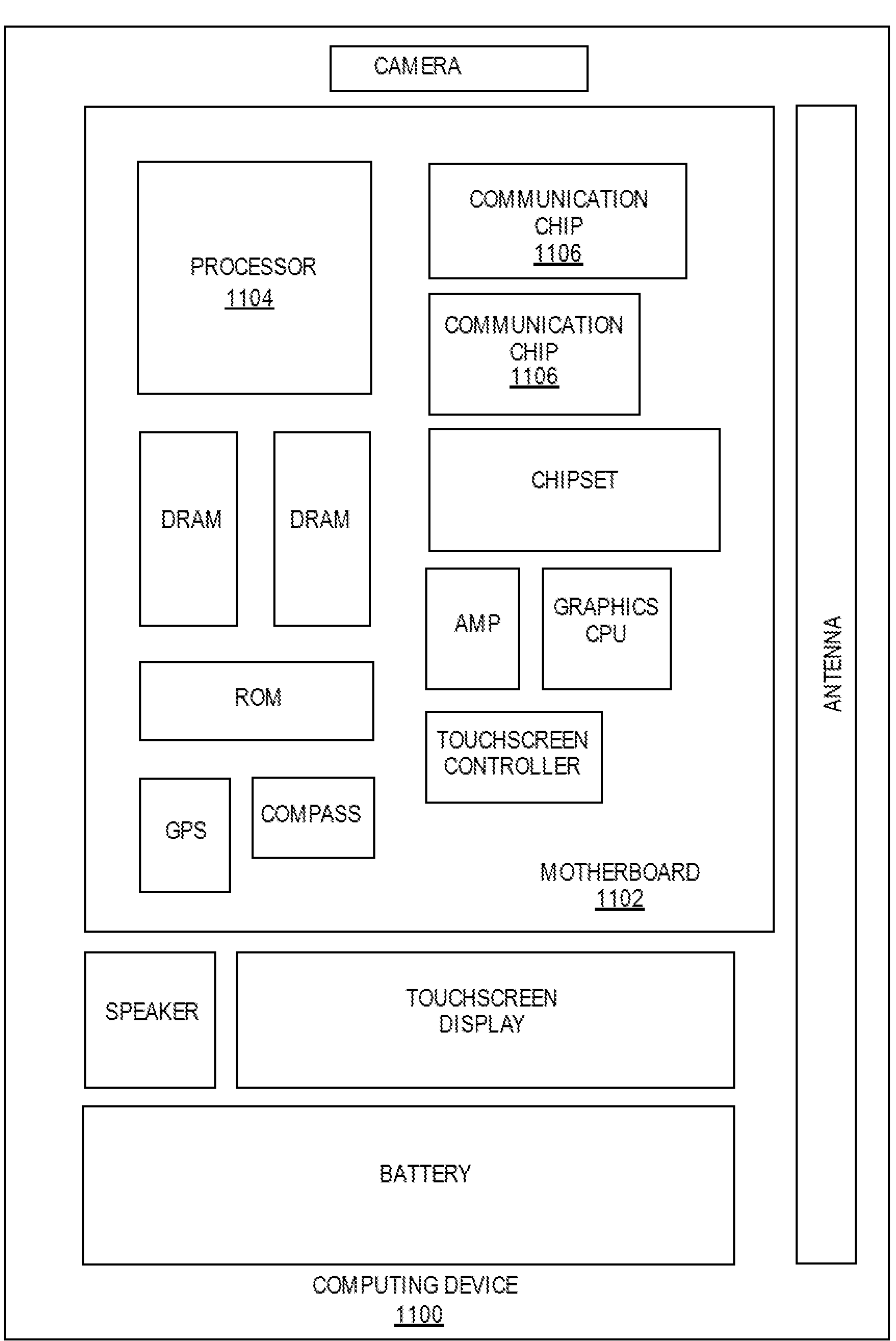
FIG. 11 is a schematic of a computing device built in accordance with an embodiment.

FIG. 11 illustrates a computing device 1100 in accordance with one implementation of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the invention, the integrated circuit die of the processor may be part of an electronic package that comprises an interposer that includes TGVs through a glass substrate or through a glass via module, in accordance with embodiments described herein. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of the invention, the integrated circuit die of the communication chip may be part of an electronic package that comprises an interposer that includes TGVs through a glass substrate or through a glass via module, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a die module, comprising: a first substrate; a first die over the first substrate; a second die over the first substrate adjacent to the first die; and a via module through the first substrate, wherein the via module comprises: a second substrate, wherein the second substrate comprises glass; and a via through the second substrate.

Example 2: the die module of Example 1, wherein the first substrate is a mold layer.

Example 3: the die module of Example 1 or Example 2, further comprising a second via through the first substrate.

Example 4: the die module of Example 3, wherein a diameter of the second via is greater than a diameter of the via through the second substrate.

Example 5: the die module of Examples 1-4, wherein the via module further comprises: a redistribution layer over the second substrate.

Example 6: the die module of Example 5, wherein the redistribution layer comprises a dielectric material.

Example 7: the die module of Example 5, wherein the redistribution layer is implemented in glass.

Example 8: the die module of Examples 1-7, wherein the via module is below the second die.

Example 9: the die module of Examples 1-8, wherein the via is a coaxial via with an outer layer and an inner core.

Example 10: the die module of Example 9, wherein the coaxial via comprises a plurality of inner cores within the outer layer.

Example 11: the die module of Example 9, wherein the outer layer comprises a gap that is filled by the second substrate.

Example 12: the die module of Examples 1-11, wherein a length of the via is greater than a width of the via.

Example 13: the die module of Examples 1-13, wherein the via is a shell, and wherein the interior of the shell is filled with a plug material.

Example 14: an electronic package, comprising: a package substrate; and a die module coupled to the package substrate, wherein the die module comprises: a first substrate; an opening through a thickness of the first substrate; a second substrate in the opening, wherein the second substrate is different than the first substrate; a via through the second substrate; and a die over the first substrate.

Example 15: the electronic package of Example 14, wherein the via is coupled to the package substrate by a solder interconnect.

Example 16: the electronic package of Example 14 or Example 15, wherein a thickness of the second substrate is substantially equal to a thickness of the first substrate.

Example 17: the electronic package of Examples 14-16, wherein the first substrate is a mold material, and the second substrate is glass.

Example 18: the electronic package of Examples 14-17, wherein a redistribution layer is provided over the second substrate.

Example 19: an electronic system, comprising: a board; an electronic package coupled to the board; and a die module coupled to the electronic package, wherein the die module comprises: a first substrate; an opening through a thickness of the first substrate; a second substrate in the opening, wherein the second substrate is different than the first substrate; a via through the second substrate; and a die over the first substrate.

Example 20: the electronic system of Example 19, wherein the first substrate is a mold material, and the second substrate is glass.

What is claimed is:

1. A die module, comprising:
- a first substrate comprising a mold layer;
- a first die over the first substrate;
- a second die over the first substrate adjacent to the first die; and
- a via module through the first substrate, wherein the via module comprises:
  - a second substrate, wherein the second substrate comprises glass, wherein the glass of the second substrate has an uppermost surface at a same level as the mold layer of the first substrate, and wherein a thickness of the second substrate is substantially equal to a thickness of the first substrate; and
  - a via through the second substrate.

2. The die module of claim 1, further comprising a second via through the first substrate.

3. The die module of claim 2, wherein a diameter of the second via is greater than a diameter of the via through the second substrate.

4. The die module of claim 1, wherein the via module further comprises:
- a redistribution layer over the second substrate.

5. The die module of claim 4, wherein the redistribution layer comprises a dielectric material.

6. The die module of claim 4, wherein the redistribution layer is implemented in glass.

7. The die module of claim 1, wherein the via module is below the second die.

8. The die module of claim 1, wherein the via is a coaxial via with an outer layer and an inner core.

9. The die module of claim 8, wherein the coaxial via comprises a plurality of inner cores within the outer layer.

10. The die module of claim 8, wherein the outer layer comprises a gap that is filled by the second substrate.

11. The die module of claim 1, wherein a length of the via is greater than a width of the via.

12. The die module of claim 1, wherein the via is a shell, and wherein an interior of the shell is filled with a plug material.

13. An electronic package, comprising:
- a package substrate; and
- a die module coupled to the package substrate, wherein the die module comprises:
  - a first substrate comprising a mold layer;
  - an opening through a thickness of the first substrate;
  - a second substrate in the opening, wherein the second substrate is different than the first substrate, wherein the second substrate comprises glass, wherein the glass of the second substrate has an uppermost surface at a same level as the mold layer of the first substrate, and wherein a thickness of the second substrate is substantially equal to a thickness of the first substrate;
  - a via through the second substrate; and
  - a die over the first substrate.

14. The electronic package of claim 13, wherein the via is coupled to the package substrate by a solder interconnect.

15. The electronic package of claim 13, wherein the first substrate is a mold material, and the second substrate is glass.

16. The electronic package of claim 13, wherein a redistribution layer is provided over the second substrate.

17. An electronic system, comprising:
- a board;
- an electronic package coupled to the board; and
- a die module coupled to the electronic package, wherein the die module comprises:
  - a first substrate comprising a mold layer;
  - an opening through a thickness of the first substrate;
  - a second substrate in the opening, wherein the second substrate is different than the first substrate, wherein the second substrate comprises glass, wherein the glass of the second substrate has an uppermost surface at a same level as the mold layer of the first substrate, and wherein a thickness of the second substrate is substantially equal to a thickness of the first substrate;
  - a via through the second substrate; and
  - a die over the first substrate.

18. The electronic system of claim 17, wherein the first substrate is a mold material, and the second substrate is glass.

* * * * *